(12) United States Patent
Sequine

(10) Patent No.: US 8,067,948 B2
(45) Date of Patent: Nov. 29, 2011

(54) INPUT/OUTPUT MULTIPLEXER BUS

(75) Inventor: Dennis R. Sequine, Monroe, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 243 days.

(21) Appl. No.: 11/709,866

(22) Filed: Feb. 21, 2007

(65) Prior Publication Data
US 2008/0312857 A1 Dec. 18, 2008

Related U.S. Application Data

(60) Provisional application No. 60/786,124, filed on Mar. 27, 2006.

(51) Int. Cl.
G01R 27/26 (2006.01)
G06F 13/14 (2006.01)

(52) U.S. Cl. ........................................ 324/678; 710/305

(58) Field of Classification Search .................. 324/678, 324/658, 649, 600, 76.59, 686, 519, 76.11, 324/158.1, 673, 761, 765; 710/313, 306, 710/305, 100
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |

(Continued)

FOREIGN PATENT DOCUMENTS

DE 19710829 A1 9/1998

(Continued)

OTHER PUBLICATIONS

Sedra, Adel S. et al., "Microelectronic Circuits," 3rd Edition, Oxford University Press, pp. xiii-xx and 861-883, 1991.

(Continued)

Primary Examiner — Hoai-An D Nguyen

(57) ABSTRACT

An input/output ("I/O") system includes a plurality of input/output ("I/O") ports, measurement circuitry, and an I/O multiplexer bus. The measurement circuitry is coupled to measure one or more electrical properties of one or more devices to be externally coupled to one or more of the I/O ports. The I/O multiplexer bus is coupled between the I/O ports and the measurement circuitry. The I/O multiplexer bus is programmable to selectively couple the measurement circuitry to any of the I/O ports.

16 Claims, 7 Drawing Sheets

U.S. PATENT DOCUMENTS

| | | | |
|---|---|---|---|
| 4,608,502 A | 8/1986 | Dijkmans et al. | |
| 4,656,603 A | 4/1987 | Dunn | |
| 4,670,838 A | 6/1987 | Kawata | |
| 4,689,740 A | 8/1987 | Moelands et al. | |
| 4,692,718 A | 9/1987 | Roza et al. | |
| 4,701,907 A | 10/1987 | Collins | |
| 4,727,541 A | 2/1988 | Mori et al. | |
| 4,736,097 A | 4/1988 | Philipp | |
| 4,740,966 A | 4/1988 | Goad | |
| 4,755,766 A | 7/1988 | Metz | |
| 4,773,024 A | 9/1988 | Faggin et al. | |
| 4,794,558 A | 12/1988 | Thompson | |
| 4,802,103 A | 1/1989 | Faggin et al. | |
| 4,802,119 A | 1/1989 | Heene et al. | |
| 4,807,183 A | 2/1989 | Kung et al. | |
| 4,809,345 A | 2/1989 | Tabata et al. | |
| 4,812,684 A | 3/1989 | Yamagiwa et al. | |
| 4,813,013 A | 3/1989 | Dunn | |
| 4,827,401 A | 5/1989 | Hrustich et al. | |
| 4,831,546 A | 5/1989 | Mitsuta et al. | |
| 4,833,418 A | 5/1989 | Quintus et al. | |
| 4,868,525 A | 9/1989 | Dias | |
| 4,876,466 A | 10/1989 | Kondou et al. | |
| 4,876,534 A | 10/1989 | Mead et al. | |
| 4,878,200 A | 10/1989 | Asghar et al. | |
| 4,879,461 A | 11/1989 | Philipp | |
| 4,879,688 A | 11/1989 | Turner et al. | |
| 4,885,484 A | 12/1989 | Gray | |
| 4,907,121 A | 3/1990 | Hrassky | |
| 4,935,702 A | 6/1990 | Mead et al. | |
| 4,939,637 A | 7/1990 | Pawloski | |
| 4,942,540 A | 7/1990 | Black et al. | |
| 4,947,169 A | 8/1990 | Smith et al. | |
| 4,953,928 A | 9/1990 | Anderson et al. | |
| 4,962,342 A | 10/1990 | Mead et al. | |
| 4,964,074 A | 10/1990 | Suzuki et al. | |
| 4,969,087 A | 11/1990 | Tanagawa et al. | |
| 4,970,408 A | 11/1990 | Hanke et al. | |
| 4,972,372 A | 11/1990 | Ueno | |
| 4,977,381 A | 12/1990 | Main | |
| 4,980,652 A | 12/1990 | Tarusawa et al. | |
| 4,999,519 A | 3/1991 | Kitsukawa et al. | |
| 5,043,674 A | 8/1991 | Bonaccio et al. | |
| 5,049,758 A | 9/1991 | Mead et al. | |
| 5,050,168 A | 9/1991 | Paterson | |
| 5,053,949 A | 10/1991 | Allison et al. | |
| 5,055,827 A | 10/1991 | Philipp | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,089,352 A | 2/1992 | Warren | |
| 5,095,284 A | 3/1992 | Mead | |
| 5,097,305 A | 3/1992 | Mead et al. | |
| 5,099,191 A | 3/1992 | Galler et al. | |
| 5,107,146 A | 4/1992 | El-Ayat | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,127,103 A | 6/1992 | Hill et al. | |
| 5,128,871 A | 7/1992 | Schmitz | |
| 5,136,188 A | 8/1992 | Ha et al. | |
| 5,140,197 A | 8/1992 | Grider | |
| 5,142,247 A | 8/1992 | Lada et al. | |
| 5,144,582 A | 9/1992 | Steele | |
| 5,146,106 A | 9/1992 | Anderson et al. | |
| 5,150,079 A | 9/1992 | Williams et al. | |
| 5,155,836 A | 10/1992 | Jordan et al. | |
| 5,159,292 A | 10/1992 | Canfield et al. | |
| 5,159,335 A * | 10/1992 | Veneruso | 340/870.02 |
| 5,160,899 A | 11/1992 | Anderson et al. | |
| 5,161,124 A | 11/1992 | Love | |
| 5,165,054 A | 11/1992 | Platt et al. | |
| 5,166,562 A | 11/1992 | Allen et al. | |
| 5,175,884 A | 12/1992 | Suarez | |
| 5,179,531 A | 1/1993 | Yamaki | |
| 5,184,061 A | 2/1993 | Lee et al. | |
| 5,198,817 A | 3/1993 | Walden et al. | |
| 5,200,751 A | 4/1993 | Smith | |
| 5,202,687 A | 4/1993 | Distinti | |
| 5,204,549 A | 4/1993 | Platt et al. | |
| 5,206,582 A | 4/1993 | Ekstedt et al. | |
| 5,220,512 A | 6/1993 | Watkins et al. | |
| 5,225,991 A | 7/1993 | Dougherty | |
| 5,230,000 A | 7/1993 | Mozingo et al. | |
| 5,235,617 A | 8/1993 | Mallard, Jr. | |
| 5,241,492 A | 8/1993 | Girardeau, Jr. | |
| 5,243,554 A | 9/1993 | Allen et al. | |
| 5,245,262 A | 9/1993 | Moody et al. | |
| 5,248,843 A | 9/1993 | Billings | |
| 5,248,873 A | 9/1993 | Allen et al. | |
| 5,258,760 A | 11/1993 | Moody et al. | |
| 5,260,592 A | 11/1993 | Mead et al. | |
| 5,260,979 A | 11/1993 | Parker et al. | |
| 5,270,963 A | 12/1993 | Allen et al. | |
| 5,276,407 A | 1/1994 | Mead et al. | |
| 5,276,739 A | 1/1994 | Krokstad et al. | |
| 5,276,890 A | 1/1994 | Arai | |
| 5,280,199 A | 1/1994 | Itakura | |
| 5,280,202 A | 1/1994 | Chan et al. | |
| 5,289,023 A | 2/1994 | Mead | |
| 5,303,329 A | 4/1994 | Mead et al. | |
| 5,304,955 A | 4/1994 | Atriss et al. | |
| 5,305,017 A | 4/1994 | Gerphide | |
| 5,305,312 A | 4/1994 | Fornek et al. | |
| 5,307,381 A | 4/1994 | Ahuja | |
| 5,313,618 A | 5/1994 | Pawloski | |
| 5,317,202 A | 5/1994 | Waizman | |
| 5,319,370 A | 6/1994 | Signore et al. | |
| 5,319,771 A | 6/1994 | Takeda | |
| 5,321,828 A | 6/1994 | Phillips et al. | |
| 5,324,958 A | 6/1994 | Mead et al. | |
| 5,325,512 A | 6/1994 | Takahashi | |
| 5,329,471 A | 7/1994 | Swoboda et al. | |
| 5,331,215 A | 7/1994 | Allen et al. | |
| 5,331,315 A | 7/1994 | Crosette | |
| 5,331,571 A | 7/1994 | Aronoff et al. | |
| 5,334,952 A | 8/1994 | Maddy et al. | |
| 5,335,342 A | 8/1994 | Pope et al. | |
| 5,336,936 A | 8/1994 | Allen et al. | |
| 5,339,213 A | 8/1994 | O'Callaghan | |
| 5,339,262 A | 8/1994 | Rostoker et al. | |
| 5,341,044 A | 8/1994 | Ahanin et al. | |
| 5,341,267 A | 8/1994 | Whitten et al. | |
| 5,345,195 A | 9/1994 | Cordoba et al. | |
| 5,349,303 A | 9/1994 | Gerpheide | |
| 5,355,097 A | 10/1994 | Scott et al. | |
| 5,357,626 A | 10/1994 | Johnson et al. | |
| 5,361,290 A | 11/1994 | Akiyama | |
| 5,371,504 A | 12/1994 | Lewis et al. | |
| 5,371,860 A | 12/1994 | Mura et al. | |
| 5,371,878 A | 12/1994 | Coker | |
| 5,371,883 A | 12/1994 | Gross et al. | |
| 5,374,787 A | 12/1994 | Miller et al. | |
| 5,377,333 A | 12/1994 | Nakagoshi et al. | |
| 5,378,935 A | 1/1995 | Korhonen et al. | |
| 5,381,515 A | 1/1995 | Platt et al. | |
| 5,384,467 A | 1/1995 | Plimon et al. | |
| 5,384,745 A | 1/1995 | Konishi et al. | |
| 5,384,910 A | 1/1995 | Torres | |
| 5,390,173 A | 2/1995 | Spinney et al. | |
| 5,392,784 A | 2/1995 | Gudaitis | |
| 5,394,522 A | 2/1995 | Sanchez-Frank et al. | |
| 5,396,245 A | 3/1995 | Rempfer | |
| 5,398,261 A | 3/1995 | Marbot | |
| 5,399,922 A | 3/1995 | Kiani et al. | |
| 5,408,194 A | 4/1995 | Steinbach et al. | |
| 5,408,235 A | 4/1995 | Doyle et al. | |
| 5,414,308 A | 5/1995 | Lee et al. | |
| 5,414,380 A | 5/1995 | Floyd et al. | |
| 5,416,895 A | 5/1995 | Anderson et al. | |
| 5,422,823 A | 6/1995 | Agrawal et al. | |
| 5,424,689 A | 6/1995 | Gillig et al. | |
| 5,426,378 A | 6/1995 | Ong | |

| Patent Number | Date | Inventor(s) |
|---|---|---|
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El-Avat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad |
| 5,488,204 A | 1/1996 | Mead et al. |
| 5,491,458 A | 2/1996 | McCune, Jr. et al. |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | MacKenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | McEwan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka et al. |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,652,893 A | 7/1997 | Ben-Meir et al. |
| 5,661,433 A | 8/1997 | LaRosa et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burilson et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Kametani |
| 5,784,545 A | 7/1998 | Anderson et al. |
| 5,790,957 A | 8/1998 | Heidari |
| 5,796,183 A | 8/1998 | Hourmand |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |

| | | | | | |
|---|---|---|---|---|---|
| 5,812,698 A | 9/1998 | Platt et al. | 5,952,888 A | 9/1999 | Scott |
| 5,818,254 A | 10/1998 | Agrawal et al. | 5,956,279 A | 9/1999 | Mo et al. |
| 5,818,444 A | 10/1998 | Alimpich et al. | 5,959,871 A | 9/1999 | Pierzchala et al. |
| 5,818,736 A | 10/1998 | Leibold | 5,963,075 A | 10/1999 | Hiiragizawa |
| 5,819,028 A | 10/1998 | Manghirmalani et al. | 5,963,105 A | 10/1999 | Nguyen |
| 5,822,387 A | 10/1998 | Mar | 5,963,503 A | 10/1999 | Lee |
| 5,822,531 A | 10/1998 | Gorczyca et al. | 5,964,893 A | 10/1999 | Circello et al. |
| 5,828,693 A | 10/1998 | Mays et al. | 5,966,027 A | 10/1999 | Kapusta et al. |
| 5,838,583 A | 11/1998 | Varadarajan et al. | 5,966,532 A | 10/1999 | McDonald et al. |
| 5,841,078 A | 11/1998 | Miller et al. | 5,968,135 A | 10/1999 | Teramoto et al. |
| 5,841,996 A | 11/1998 | Nolan et al. | 5,969,513 A | 10/1999 | Clark |
| 5,844,256 A | 12/1998 | Mead et al. | 5,969,632 A | 10/1999 | Diamant et al. |
| 5,844,265 A | 12/1998 | Mead et al. | 5,973,368 A | 10/1999 | Pearce et al. |
| 5,844,404 A | 12/1998 | Caser et al. | 5,974,235 A | 10/1999 | Nunally et al. |
| 5,848,285 A | 12/1998 | Kapusta et al. | 5,977,791 A | 11/1999 | Veenstra |
| 5,850,156 A | 12/1998 | Wittman | 5,978,584 A | 11/1999 | Nishibata et al. |
| 5,852,733 A | 12/1998 | Chien et al. | 5,978,937 A | 11/1999 | Miyamori et al. |
| 5,854,625 A | 12/1998 | Frisch et al. | 5,982,105 A | 11/1999 | Masters |
| 5,857,109 A | 1/1999 | Taylor | 5,982,229 A | 11/1999 | Wong et al. |
| 5,861,583 A | 1/1999 | Schediwy et al. | 5,982,241 A | 11/1999 | Nguyen et al. |
| 5,861,875 A | 1/1999 | Gerpheide | 5,983,227 A | 11/1999 | Helle et al. |
| 5,864,242 A | 1/1999 | Allen et al. | 5,986,479 A | 11/1999 | Mohan |
| 5,864,392 A | 1/1999 | Winklhofer et al. | 5,987,246 A | 11/1999 | Thomsen et al. |
| 5,867,046 A | 2/1999 | Sugasawa | 5,988,902 A | 11/1999 | Holehan |
| 5,867,399 A | 2/1999 | Rostoker et al. | 5,994,939 A | 11/1999 | Johnson et al. |
| 5,869,979 A | 2/1999 | Bocchino | 5,996,032 A | 11/1999 | Baker |
| 5,870,004 A | 2/1999 | Lu | 5,999,725 A | 12/1999 | Barbier et al. |
| 5,870,309 A | 2/1999 | Lawman | 6,002,268 A | 12/1999 | Sasaki et al. |
| 5,870,345 A | 2/1999 | Stecker | 6,002,398 A | 12/1999 | Wilson |
| 5,872,464 A | 2/1999 | Gradinariu | 6,003,054 A | 12/1999 | Oshima et al. |
| 5,874,958 A | 2/1999 | Ludolph | 6,003,107 A | 12/1999 | Ranson et al. |
| 5,875,293 A | 2/1999 | Bell et al. | 6,003,133 A | 12/1999 | Moughanni et al. |
| 5,877,656 A | 3/1999 | Mann et al. | 6,005,814 A | 12/1999 | Mulholland et al. |
| 5,878,425 A | 3/1999 | Redpath | 6,005,904 A | 12/1999 | Knapp et al. |
| 5,880,411 A | 3/1999 | Gillespie et al. | 6,008,685 A | 12/1999 | Kunst |
| 5,880,598 A | 3/1999 | Duong | 6,008,703 A | 12/1999 | Perrott et al. |
| 5,883,623 A | 3/1999 | Cseri | 6,009,270 A | 12/1999 | Mann |
| 5,886,582 A | 3/1999 | Stansell | 6,009,496 A | 12/1999 | Tsai |
| 5,887,189 A | 3/1999 | Birns et al. | 6,011,407 A | 1/2000 | New |
| 5,889,236 A | 3/1999 | Gillespie et al. | 6,012,835 A | 1/2000 | Thompson et al. |
| 5,889,723 A | 3/1999 | Pascucci | 6,014,135 A | 1/2000 | Fernandes |
| 5,889,936 A | 3/1999 | Chan | 6,014,509 A | 1/2000 | Furtek et al. |
| 5,889,988 A | 3/1999 | Held | 6,014,723 A | 1/2000 | Tremblay et al. |
| 5,894,226 A * | 4/1999 | Koyama ........................ 324/765 | 6,016,554 A | 1/2000 | Skrovan et al. |
| 5,894,243 A | 4/1999 | Hwang | 6,016,563 A | 1/2000 | Fleisher |
| 5,894,565 A | 4/1999 | Furtek et al. | 6,018,559 A | 1/2000 | Azegami et al. |
| 5,895,494 A | 4/1999 | Scalzi et al. | 6,023,422 A | 2/2000 | Allen et al. |
| 5,896,068 A | 4/1999 | Moyal | 6,023,565 A | 2/2000 | Lawman et al. |
| 5,896,330 A | 4/1999 | Gibson | 6,026,134 A | 2/2000 | Duffy et al. |
| 5,898,345 A | 4/1999 | Namura et al. | 6,026,501 A | 2/2000 | Hohl et al. |
| 5,900,780 A | 5/1999 | Hirose et al. | 6,028,271 A | 2/2000 | Gillespie et al. |
| 5,901,062 A | 5/1999 | Burch et al. | 6,028,959 A | 2/2000 | Wang et al. |
| 5,903,718 A | 5/1999 | Marik | 6,031,365 A | 2/2000 | Sharpe-Geisler |
| 5,905,398 A | 5/1999 | Todsen et al. | 6,032,268 A | 2/2000 | Swoboda et al. |
| 5,909,544 A | 6/1999 | Anderson, II et al. | 6,034,538 A | 3/2000 | Abramovici |
| 5,911,059 A | 6/1999 | Profit, Jr. | 6,035,320 A | 3/2000 | Kiriaki et al. |
| 5,914,465 A | 6/1999 | Allen et al. | 6,037,807 A | 3/2000 | Wu et al. |
| 5,914,633 A | 6/1999 | Comino et al. | 6,038,551 A | 3/2000 | Barlow et al. |
| 5,914,708 A | 6/1999 | LaGrange et al. | 6,041,406 A | 3/2000 | Mann |
| 5,917,356 A | 6/1999 | Casal et al. | 6,043,695 A | 3/2000 | O'Sullivan |
| 5,920,310 A | 7/1999 | Faggin et al. | 6,043,719 A | 3/2000 | Lin et al. |
| 5,923,264 A | 7/1999 | Lavelle et al. | 6,049,223 A | 4/2000 | Lytle et al. |
| 5,926,566 A | 7/1999 | Wang et al. | 6,049,225 A | 4/2000 | Huang et al. |
| 5,929,710 A | 7/1999 | Bien | 6,051,772 A | 4/2000 | Cameron et al. |
| 5,930,148 A | 7/1999 | Bjorksten et al. | 6,052,035 A | 4/2000 | Nolan et al. |
| 5,930,150 A | 7/1999 | Cohen et al. | 6,052,524 A | 4/2000 | Pauna |
| 5,931,959 A | 8/1999 | Kwiat | 6,055,584 A | 4/2000 | Bridges et al. |
| 5,933,023 A | 8/1999 | Young | 6,057,705 A | 5/2000 | Wojewoda et al. |
| 5,933,356 A | 8/1999 | Rostoker et al. | 6,058,263 A | 5/2000 | Voth |
| 5,933,816 A | 8/1999 | Zeanah et al. | 6,058,452 A | 5/2000 | Rangasayee et al. |
| 5,935,233 A | 8/1999 | Jeddeloh | 6,061,511 A | 5/2000 | Marantz et al. |
| 5,935,266 A | 8/1999 | Thurnhofer et al. | 6,066,961 A | 5/2000 | Lee et al. |
| 5,939,904 A | 8/1999 | Fetterman et al. | 6,070,003 A | 5/2000 | Gove et al. |
| 5,939,949 A | 8/1999 | Olgaard et al. | 6,072,803 A | 6/2000 | Allmond et al. |
| 5,941,991 A | 8/1999 | Kageshima | 6,075,941 A | 6/2000 | Itoh et al. |
| 5,942,733 A | 8/1999 | Allen et al. | 6,079,985 A | 6/2000 | Wohl et al. |
| 5,943,052 A | 8/1999 | Allen et al. | 6,081,140 A | 6/2000 | King |
| 5,945,878 A | 8/1999 | Westwick et al. | 6,094,730 A | 7/2000 | Lopez et al. |
| 5,949,632 A | 9/1999 | Barreras, Sr. et al. | 6,097,211 A | 8/2000 | Couts-Martin et al. |

| | | | | | | | |
|---|---|---|---|---|---|---|---|
| 6,097,432 | A | 8/2000 | Mead et al. | 6,225,866 | B1 | 5/2001 | Kubota et al. |
| 6,101,457 | A | 8/2000 | Barch et al. | 6,236,242 | B1 | 5/2001 | Hedberg |
| 6,101,617 | A | 8/2000 | Burckhartt et al. | 6,236,275 | B1 | 5/2001 | Dent |
| 6,104,217 | A | 8/2000 | Magana | 6,236,278 | B1 | 5/2001 | Olgaard |
| 6,104,325 | A | 8/2000 | Liaw et al. | 6,236,593 | B1 | 5/2001 | Hong et al. |
| 6,107,769 | A | 8/2000 | Saylor et al. | 6,239,389 | B1 | 5/2001 | Allen et al. |
| 6,107,826 | A | 8/2000 | Young et al. | 6,239,798 | B1 | 5/2001 | Ludolph et al. |
| 6,107,882 | A | 8/2000 | Gabara et al. | 6,240,375 | B1 | 5/2001 | Sonoda |
| 6,110,223 | A | 8/2000 | Southgate et al. | 6,246,258 | B1 | 6/2001 | Lesea |
| 6,111,431 | A | 8/2000 | Estrada | 6,246,410 | B1 | 6/2001 | Bergeron et al. |
| 6,112,264 | A | 8/2000 | Beasley et al. | 6,249,167 | B1 | 6/2001 | Oguchi et al. |
| 6,121,791 | A | 9/2000 | Abbott | 6,249,447 | B1 | 6/2001 | Boylan et al. |
| 6,121,805 | A | 9/2000 | Thamsirianunt et al. | 6,253,250 | B1 | 6/2001 | Evans et al. |
| 6,121,965 | A | 9/2000 | Kenney et al. | 6,253,754 | B1 | 7/2001 | Roohparvar |
| 6,125,416 | A | 9/2000 | Warren | 6,262,717 | B1 | 7/2001 | Donohue et al. |
| 6,130,548 | A | 10/2000 | Koifman | 6,263,302 | B1 | 7/2001 | Hellestrand et al. |
| 6,130,551 | A | 10/2000 | Agrawal et al. | 6,263,339 | B1 | 7/2001 | Hirsh |
| 6,130,552 | A | 10/2000 | Jefferson et al. | 6,263,484 | B1 | 7/2001 | Yang |
| 6,133,773 | A | 10/2000 | Garlepp et al. | 6,271,679 | B1 | 8/2001 | McClintock et al. |
| 6,134,181 | A | 10/2000 | Landry | 6,272,646 | B1 | 8/2001 | Rangasayee et al. |
| 6,134,516 | A | 10/2000 | Wang et al. | 6,275,117 | B1 | 8/2001 | Abugharbieh et al. |
| 6,137,308 | A | 10/2000 | Nayak | 6,278,568 | B1 | 8/2001 | Cloke et al. |
| 6,140,853 | A | 10/2000 | Lo | 6,280,391 | B1 | 8/2001 | Olson et al. |
| 6,141,376 | A | 10/2000 | Shaw | 6,281,753 | B1 | 8/2001 | Corsi et al. |
| 6,141,764 | A | 10/2000 | Ezell | 6,282,547 | B1 | 8/2001 | Hirsh |
| 6,144,327 | A | 11/2000 | Distinti et al. | 6,282,551 | B1 | 8/2001 | Anderson et al. |
| 6,148,104 | A | 11/2000 | Wang et al. | 6,286,127 | B1 | 9/2001 | King et al. |
| 6,148,441 | A | 11/2000 | Woodward | 6,288,707 | B1 | 9/2001 | Philipp |
| 6,149,299 | A | 11/2000 | Aslan et al. | 6,289,300 | B1 | 9/2001 | Brannick et al. |
| 6,150,866 | A | 11/2000 | Eto et al. | 6,289,478 | B1 | 9/2001 | Kitagaki |
| 6,154,064 | A | 11/2000 | Proebsting | 6,289,489 | B1 | 9/2001 | Bold et al. |
| 6,157,024 | A | 12/2000 | Chapdelaine et al. | 6,292,028 | B1 | 9/2001 | Tomita |
| 6,157,270 | A | 12/2000 | Tso | 6,294,932 | B1 | 9/2001 | Watarai |
| 6,161,199 | A | 12/2000 | Szeto et al. | 6,294,962 | B1 | 9/2001 | Mar |
| 6,166,367 | A | 12/2000 | Cho | 6,298,320 | B1 | 10/2001 | Buckmaster et al. |
| 6,166,960 | A | 12/2000 | Marneweck et al. | 6,304,014 | B1 | 10/2001 | England et al. |
| 6,167,077 | A | 12/2000 | Ducaroir et al. | 6,304,101 | B1 | 10/2001 | Nishihara |
| 6,167,364 | A | 12/2000 | Stellenberg et al. | 6,304,790 | B1 | 10/2001 | Nakamura et al. |
| 6,167,559 | A | 12/2000 | Furtek et al. | 6,307,413 | B1 | 10/2001 | Dalmia et al. |
| 6,169,383 | B1 | 1/2001 | Sabin et al. | 6,310,521 | B1 | 10/2001 | Dalmia |
| 6,172,428 | B1 | 1/2001 | Jordan | 6,310,611 | B1 | 10/2001 | Caldwell |
| 6,172,571 | B1 | 1/2001 | Moyal et al. | 6,311,149 | B1 | 10/2001 | Ryan et al. |
| 6,173,419 | B1 | 1/2001 | Barnett | 6,314,530 | B1 | 11/2001 | Mann |
| 6,175,914 | B1 | 1/2001 | Mann | 6,320,184 | B1 | 11/2001 | Winklhofer et al. |
| 6,175,949 | B1 | 1/2001 | Gristede et al. | 6,320,282 | B1 | 11/2001 | Caldwell |
| 6,181,163 | B1 | 1/2001 | Agrawal et al. | 6,321,369 | B1 | 11/2001 | Heile et al. |
| 6,183,131 | B1 | 2/2001 | Holloway et al. | 6,323,846 | B1 | 11/2001 | Westerman et al. |
| 6,185,127 | B1 | 2/2001 | Myers et al. | 6,324,628 | B1 | 11/2001 | Chan |
| 6,185,450 | B1 | 2/2001 | Seguine et al. | 6,326,859 | B1 | 12/2001 | Goldman et al. |
| 6,185,522 | B1 | 2/2001 | Bakker | 6,332,137 | B1 | 12/2001 | Hori et al. |
| 6,185,703 | B1 | 2/2001 | Guddat et al. | 6,332,201 | B1 | 12/2001 | Chin et al. |
| 6,185,732 | B1 | 2/2001 | Mann et al. | 6,337,579 | B1 | 1/2002 | Mochida |
| 6,188,228 | B1 | 2/2001 | Philipp | 6,338,109 | B1 | 1/2002 | Snyder et al. |
| 6,188,241 | B1 | 2/2001 | Gauthier et al. | 6,339,815 | B1 | 1/2002 | Feng et al. |
| 6,188,381 | B1 | 2/2001 | van der Wal et al. | 6,342,907 | B1 | 1/2002 | Petty et al. |
| 6,188,391 | B1 | 2/2001 | Seely et al. | 6,345,383 | B1 | 2/2002 | Ueki |
| 6,188,975 | B1 | 2/2001 | Gay | 6,347,395 | B1 | 2/2002 | Payne et al. |
| 6,191,603 | B1 | 2/2001 | Muradali et al. | 6,351,789 | B1 | 2/2002 | Green |
| 6,191,660 | B1 | 2/2001 | Mar et al. | 6,353,452 | B1 | 3/2002 | Hamada et al. |
| 6,191,998 | B1 | 2/2001 | Reddy et al. | 6,355,980 | B1 | 3/2002 | Callahan |
| 6,192,431 | B1 | 2/2001 | Dabral et al. | 6,356,862 | B2 | 3/2002 | Bailey |
| 6,198,303 | B1 | 3/2001 | Rangasayee | 6,356,958 | B1 | 3/2002 | Lin |
| 6,201,407 | B1 | 3/2001 | Kapusta et al. | 6,356,960 | B1 | 3/2002 | Jones et al. |
| 6,201,829 | B1 | 3/2001 | Schneider | 6,359,950 | B2 | 3/2002 | Gossmann et al. |
| 6,202,044 | B1 | 3/2001 | Tzori | 6,362,697 | B1 | 3/2002 | Pulvirenti |
| 6,204,687 | B1 | 3/2001 | Schultz et al. | 6,366,174 | B1 | 4/2002 | Berry et al. |
| 6,205,574 | B1 | 3/2001 | Dellinger et al. | 6,366,300 | B1 | 4/2002 | Ohara et al. |
| 6,208,572 | B1 | 3/2001 | Adams et al. | 6,366,874 | B1 | 4/2002 | Lee et al. |
| 6,211,708 | B1 | 4/2001 | Klemmer | 6,366,878 | B1 | 4/2002 | Grunert |
| 6,211,715 | B1 | 4/2001 | Terauchi | 6,369,660 | B1 | 4/2002 | Wei et al. |
| 6,211,741 | B1 | 4/2001 | Dalmia | 6,371,878 | B1 | 4/2002 | Bowen |
| 6,215,352 | B1 | 4/2001 | Sudo | 6,373,954 | B1 | 4/2002 | Malcolm et al. |
| 6,216,254 | B1 | 4/2001 | Pesce et al. | 6,374,370 | B1 | 4/2002 | Bockhaus et al. |
| 6,219,729 | B1 | 4/2001 | Keats et al. | 6,377,009 | B1 | 4/2002 | Philipp |
| 6,222,528 | B1 | 4/2001 | Gerpheide et al. | 6,377,575 | B1 | 4/2002 | Mullaney et al. |
| 6,223,144 | B1 | 4/2001 | Barnett et al. | 6,377,646 | B1 | 4/2002 | Sha |
| 6,223,147 | B1 | 4/2001 | Bowers | 6,380,811 | B1 | 4/2002 | Zarubinsky et al. |
| 6,223,272 | B1 | 4/2001 | Coehlo et al. | 6,380,929 | B1 | 4/2002 | Platt |
| RE37,195 | E | 5/2001 | Kean | 6,380,931 | B1 | 4/2002 | Gillespie et al. |

| Patent | Kind | Date | Inventor |
|---|---|---|---|
| 6,384,947 | B1 | 5/2002 | Ackerman et al. |
| 6,385,742 | B1 | 5/2002 | Kirsch et al. |
| 6,388,109 | B1 | 5/2002 | Shwarz et al. |
| 6,388,464 | B1 | 5/2002 | Lacey et al. |
| 6,396,302 | B2 | 5/2002 | New et al. |
| 6,396,657 | B1 | 5/2002 | Sun et al. |
| 6,397,232 | B1 | 5/2002 | Cheng-Hung et al. |
| 6,401,230 | B1 | 6/2002 | Ahanessians et al. |
| 6,404,204 | B1 | 6/2002 | Farruggia et al. |
| 6,404,445 | B1 | 6/2002 | Galea et al. |
| 6,407,953 | B1 | 6/2002 | Cleeves |
| 6,408,432 | B1 | 6/2002 | Herrmann et al. |
| 6,411,665 | B1 | 6/2002 | Chan et al. |
| 6,411,974 | B1 | 6/2002 | Graham et al. |
| 6,414,671 | B1 | 7/2002 | Gillespie et al. |
| 6,421,698 | B1 | 7/2002 | Hong |
| 6,421,817 | B1 | 7/2002 | Mohan et al. |
| 6,425,109 | B1 | 7/2002 | Choukalos et al. |
| 6,429,882 | B1 | 8/2002 | Abdelnur et al. |
| 6,430,305 | B1 | 8/2002 | Decker |
| 6,433,645 | B1 | 8/2002 | Mann et al. |
| 6,434,187 | B1 | 8/2002 | Beard |
| 6,437,805 | B1 | 8/2002 | Sojoodi et al. |
| 6,438,565 | B1 | 8/2002 | Ammirato et al. |
| 6,438,735 | B1 | 8/2002 | McElvain et al. |
| 6,438,738 | B1 | 8/2002 | Elayda |
| 6,441,073 | B1 | 8/2002 | Tanaka et al. |
| 6,445,211 | B1 | 9/2002 | Saripella |
| 6,449,628 | B1 | 9/2002 | Wasson |
| 6,449,755 | B1 | 9/2002 | Beausang et al. |
| 6,449,761 | B1 | 9/2002 | Greidinger et al. |
| 6,452,437 | B1 | 9/2002 | Takeuchi et al. |
| 6,452,514 | B1 | 9/2002 | Philipp |
| 6,453,175 | B2 | 9/2002 | Mizell et al. |
| 6,453,461 | B1 | 9/2002 | Chaiken |
| 6,456,304 | B1 | 9/2002 | Angiulo et al. |
| 6,457,355 | B1 | 10/2002 | Philipp |
| 6,457,479 | B1 | 10/2002 | Zhuang et al. |
| 6,460,172 | B1 | 10/2002 | Insenser Farre et al. |
| 6,463,488 | B1 | 10/2002 | San Juan |
| 6,466,036 | B1 | 10/2002 | Philipp |
| 6,466,078 | B1 | 10/2002 | Stiff |
| 6,466,898 | B1 | 10/2002 | Chan |
| 6,473,069 | B1 | 10/2002 | Gerpheide |
| 6,473,825 | B1 | 10/2002 | Worley et al. |
| 6,477,691 | B1 | 11/2002 | Bergamashi/Rab et al. |
| 6,480,921 | B1* | 11/2002 | Mansoorian et al. ......... 710/305 |
| 6,483,343 | B1 | 11/2002 | Faith et al. |
| 6,487,700 | B1 | 11/2002 | Fukushima |
| 6,489,899 | B1 | 12/2002 | Ely et al. |
| 6,490,213 | B1 | 12/2002 | Mu et al. |
| 6,492,834 | B1 | 12/2002 | Lytle et al. |
| 6,496,969 | B2 | 12/2002 | Feng et al. |
| 6,496,971 | B1 | 12/2002 | Lesea et al. |
| 6,498,720 | B2 | 12/2002 | Glad |
| 6,499,134 | B1 | 12/2002 | Buffet et al. |
| 6,499,359 | B1 | 12/2002 | Washeleski et al. |
| 6,504,403 | B2 | 1/2003 | Bangs et al. |
| 6,507,214 | B1 | 1/2003 | Snyder |
| 6,507,215 | B1 | 1/2003 | Piasecki et al. |
| 6,507,857 | B1 | 1/2003 | Yalcinalp |
| 6,509,758 | B2 | 1/2003 | Piasecki et al. |
| 6,512,395 | B1 | 1/2003 | Lacey et al. |
| 6,516,428 | B2 | 2/2003 | Wenzel et al. |
| 6,522,128 | B1 | 2/2003 | Ely et al. |
| 6,523,416 | B2 | 2/2003 | Takagi et al. |
| 6,525,593 | B1 | 2/2003 | Mar |
| 6,526,556 | B1 | 2/2003 | Stoica et al. |
| 6,529,791 | B1 | 3/2003 | Takagi |
| 6,530,065 | B1 | 3/2003 | McDonald et al. |
| 6,534,970 | B1 | 3/2003 | Ely et al. |
| 6,535,061 | B2 | 3/2003 | Darmawaskita et al. |
| 6,535,200 | B2 | 3/2003 | Philipp |
| 6,535,946 | B1 | 3/2003 | Bryant et al. |
| 6,536,028 | B1 | 3/2003 | Katsioulas et al. |
| 6,539,534 | B1 | 3/2003 | Bennett |
| 6,542,025 | B1 | 4/2003 | Kutz et al. |
| 6,542,844 | B1 | 4/2003 | Hanna |
| 6,542,845 | B1 | 4/2003 | Grucci et al. |
| 6,546,297 | B1 | 4/2003 | Gaston et al. |
| 6,552,933 | B1 | 4/2003 | Roohparvar |
| 6,553,057 | B1 | 4/2003 | Sha et al. |
| 6,554,469 | B1 | 4/2003 | Thomson et al. |
| 6,556,044 | B2 | 4/2003 | Langhammer et al. |
| 6,557,164 | B1 | 4/2003 | Faustini |
| 6,559,685 | B2 | 5/2003 | Green |
| 6,560,306 | B1 | 5/2003 | Duffy et al. |
| 6,560,699 | B1 | 5/2003 | Konkle |
| 6,563,391 | B1 | 5/2003 | Mar |
| 6,564,179 | B1 | 5/2003 | Belhaj |
| 6,566,961 | B2 | 5/2003 | Dasgupta et al. |
| 6,567,426 | B1 | 5/2003 | van Hook et al. |
| 6,567,932 | B2 | 5/2003 | Edwards et al. |
| 6,570,557 | B1 | 5/2003 | Westerman et al. |
| 6,571,331 | B2 | 5/2003 | Henry et al. |
| 6,571,373 | B1 | 5/2003 | Devins et al. |
| 6,574,590 | B1 | 6/2003 | Kershaw et al. |
| 6,574,739 | B1 | 6/2003 | Kung et al. |
| 6,575,373 | B1 | 6/2003 | Nakano |
| 6,577,258 | B2 | 6/2003 | Ruha et al. |
| 6,578,174 | B2 | 6/2003 | Zizzo |
| 6,580,329 | B2 | 6/2003 | Sander |
| 6,581,191 | B1 | 6/2003 | Schubert et al. |
| 6,587,093 | B1 | 7/2003 | Shaw et al. |
| 6,587,995 | B1 | 7/2003 | Duboc et al. |
| 6,588,004 | B1 | 7/2003 | Southgate et al. |
| 6,590,422 | B1 | 7/2003 | Dillon |
| 6,590,517 | B1 | 7/2003 | Swanson |
| 6,590,589 | B1 | 7/2003 | Sluiman et al. |
| 6,591,369 | B1 | 7/2003 | Edwards et al. |
| 6,592,626 | B1 | 7/2003 | Bauchot et al. |
| 6,594,799 | B1 | 7/2003 | Robertson et al. |
| 6,597,212 | B1 | 7/2003 | Wang et al. |
| 6,597,824 | B2 | 7/2003 | Newberg et al. |
| 6,598,178 | B1 | 7/2003 | Yee et al. |
| 6,600,346 | B1 | 7/2003 | Macaluso |
| 6,600,351 | B2 | 7/2003 | Bisanti et al. |
| 6,600,575 | B1 | 7/2003 | Kohara |
| 6,601,189 | B1 | 7/2003 | Edwards et al. |
| 6,601,236 | B1 | 7/2003 | Curtis |
| 6,603,330 | B1 | 8/2003 | Snyder |
| 6,603,348 | B1 | 8/2003 | Preuss et al. |
| 6,604,179 | B2 | 8/2003 | Volk et al. |
| 6,606,731 | B1 | 8/2003 | Baum et al. |
| 6,608,472 | B1 | 8/2003 | Kutz et al. |
| 6,610,936 | B2 | 8/2003 | Gillespie et al. |
| 6,611,220 | B1 | 8/2003 | Snyder |
| 6,611,276 | B1 | 8/2003 | Muratori et al. |
| 6,611,856 | B1 | 8/2003 | Liao et al. |
| 6,611,952 | B1 | 8/2003 | Prakash et al. |
| 6,613,098 | B1 | 9/2003 | Sorge et al. |
| 6,614,260 | B1 | 9/2003 | Welch et al. |
| 6,614,320 | B1 | 9/2003 | Sullam et al. |
| 6,614,374 | B1 | 9/2003 | Gustavsson et al. |
| 6,614,458 | B1 | 9/2003 | Lambert et al. |
| 6,615,167 | B1 | 9/2003 | Devins et al. |
| 6,617,888 | B2 | 9/2003 | Volk |
| 6,618,854 | B1 | 9/2003 | Mann |
| 6,621,356 | B2 | 9/2003 | Gotz et al. |
| 6,624,640 | B2 | 9/2003 | Lund et al. |
| 6,625,765 | B1 | 9/2003 | Krishnan |
| 6,628,163 | B2 | 9/2003 | Dathe et al. |
| 6,628,311 | B1 | 9/2003 | Fang |
| 6,631,508 | B1 | 10/2003 | Williams |
| 6,634,008 | B1 | 10/2003 | Dole |
| 6,634,009 | B1 | 10/2003 | Molson et al. |
| 6,636,096 | B2 | 10/2003 | Schaffer et al. |
| 6,636,169 | B1 | 10/2003 | Distinti et al. |
| 6,637,015 | B1 | 10/2003 | Ogami et al. |
| 6,639,586 | B2 | 10/2003 | Gerpheide |
| 6,642,857 | B1 | 11/2003 | Schediwy et al. |
| 6,643,151 | B1 | 11/2003 | Nebrigic et al. |
| 6,643,810 | B2* | 11/2003 | Whetsel ........................ 714/724 |
| 6,649,924 | B1 | 11/2003 | Philipp et al. |
| 6,650,581 | B2 | 11/2003 | Hong et al. |
| 6,658,498 | B1 | 12/2003 | Carney et al. |
| 6,658,633 | B2 | 12/2003 | Devins et al. |
| 6,661,288 | B2 | 12/2003 | Morgan et al. |

| | | |
|---|---|---|
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,671,869 B2 | 12/2003 | Davidson et al. |
| 3,378,877 A1 | 1/2004 | Perry et al. |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie et al. |
| 6,750,876 B1 | 6/2004 | Atsatt et al. |
| 6,750,889 B1 | 6/2004 | Livingston et al. |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hilderbrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 * | 1/2005 | Conti et al. ............. 324/158.1 |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 * | 5/2005 | Lutz et al. .................... 340/506 |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Muller et al. |
| 6,934,674 B1 | 8/2005 | Douezy et al. |
| 6,937,075 B2 | 8/2005 | Lim et al. |
| 6,940,356 B2 | 9/2005 | McDonald et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |

| | | | | | | |
|---|---|---|---|---|---|---|
| 6,967,511 B1 | 11/2005 | Sullam | 7,212,189 B2 | 5/2007 | Shaw et al. | |
| 6,967,960 B1 | 11/2005 | Bross et al. | 7,221,187 B1 | 5/2007 | Snyder et al. | |
| 6,968,346 B2 | 11/2005 | Hekmatpour | 7,227,389 B2 | 6/2007 | Gong et al. | |
| 6,969,978 B2 | 11/2005 | Dening | 7,236,921 B1 | 6/2007 | Nemecek et al. | |
| 6,970,844 B1 | 11/2005 | Bierenbaum | 7,250,825 B2 | 7/2007 | Wilson et al. | |
| 6,971,004 B1 | 11/2005 | Pleis et al. | 7,256,588 B2 | 8/2007 | Howard et al. | |
| 6,973,400 B2 | 12/2005 | Cahill-O'Brien et al. | 7,265,633 B2 | 9/2007 | Stiff | |
| 6,975,123 B1 | 12/2005 | Malang et al. | 7,266,768 B2 | 9/2007 | Ferlitsch et al. | |
| 6,980,060 B2 | 12/2005 | Boerstler et al. | 7,281,846 B2 | 10/2007 | McLeod | |
| 6,981,090 B1 | 12/2005 | Kutz et al. | 7,282,905 B2 * | 10/2007 | Chen et al. | 324/158.1 |
| 6,988,192 B2 | 1/2006 | Snider | 7,283,151 B2 | 10/2007 | Nihei et al. | |
| 6,996,799 B1 | 2/2006 | Cismas et al. | 7,283,410 B2 | 10/2007 | Hsu et al. | |
| 7,005,933 B1 | 2/2006 | Shutt | 7,287,112 B1 | 10/2007 | Pleis et al. | |
| 7,009,444 B1 | 3/2006 | Scott | 7,288,977 B2 | 10/2007 | Stanley | |
| 7,010,773 B1 | 3/2006 | Bartz et al. | 7,290,244 B2 | 10/2007 | Peck et al. | |
| 7,015,735 B2 | 3/2006 | Kimura et al. | 7,295,049 B1 | 11/2007 | Moyal et al. | |
| 7,017,145 B2 | 3/2006 | Taylor | 7,298,124 B2 | 11/2007 | Kan et al. | |
| 7,017,409 B2 | 3/2006 | Zielinski et al. | 7,301,835 B2 | 11/2007 | Joshi et al. | |
| 7,020,854 B2 | 3/2006 | Killian et al. | 7,305,510 B2 | 12/2007 | Miller | |
| 7,023,215 B2 | 4/2006 | Seenwyk | 7,307,485 B1 * | 12/2007 | Snyder et al. | 331/150 |
| 7,023,257 B1 | 4/2006 | Sullam | 7,308,608 B1 | 12/2007 | Pleis et al. | |
| 7,024,636 B2 | 4/2006 | Weed | 7,312,616 B2 * | 12/2007 | Snyder | 324/658 |
| 7,024,654 B2 | 4/2006 | Bersch et al. | 7,323,879 B2 | 1/2008 | Kuo et al. | |
| 7,026,861 B2 | 4/2006 | Seenwyk | 7,324,380 B2 | 1/2008 | Negut et al. | |
| 7,030,513 B2 | 4/2006 | Caldwell | 7,332,976 B1 | 2/2008 | Brennan | |
| 7,030,656 B2 | 4/2006 | Lo et al. | 7,342,405 B2 * | 3/2008 | Eldridge et al. | 324/765 |
| 7,030,688 B2 | 4/2006 | Dosho et al. | 7,358,714 B2 | 4/2008 | Watanabe et al. | |
| 7,030,782 B2 | 4/2006 | Ely et al. | 7,367,017 B2 | 4/2008 | Maddocks et al. | |
| 7,034,603 B2 | 4/2006 | Brady et al. | 7,373,437 B2 | 5/2008 | Seigneret et al. | |
| 7,042,301 B2 | 5/2006 | Sutardja | 7,376,001 B2 | 5/2008 | Joshi et al. | |
| 7,047,166 B2 | 5/2006 | Dancea | 7,376,904 B2 | 5/2008 | Cifra et al. | |
| 7,055,035 B2 | 5/2006 | Allison et al. | 7,386,740 B2 | 6/2008 | Kutz et al. | |
| 7,058,921 B1 | 6/2006 | Hwang et al. | 7,392,011 B1 | 6/2008 | Jacomb-Hood | |
| 7,073,158 B2 | 7/2006 | McCubbrey | 7,400,183 B1 | 7/2008 | Sivadasan et al. | |
| 7,076,420 B1 | 7/2006 | Snyder et al. | 7,406,674 B1 | 7/2008 | Ogami et al. | |
| 7,079,166 B1 | 7/2006 | Hong | 7,421,251 B2 | 9/2008 | Westwick et al. | |
| 7,086,014 B1 | 8/2006 | Bartz et al. | 7,461,274 B2 | 12/2008 | Merkin | |
| 7,088,166 B1 | 8/2006 | Reinschmidt et al. | 7,466,307 B2 | 12/2008 | Trent, Jr. et al. | |
| 7,089,175 B1 | 8/2006 | Nemecek et al. | 7,542,533 B2 | 6/2009 | Jasa et al. | |
| 7,091,713 B2 | 8/2006 | Erdelyi et al. | 7,554,847 B2 | 6/2009 | Lee | |
| 7,092,980 B1 | 8/2006 | Mar et al. | 7,616,509 B2 | 11/2009 | Qureshi et al. | |
| 7,098,414 B2 | 8/2006 | Caldwell | 7,809,545 B2 | 10/2010 | Ciolfi et al. | |
| 7,099,818 B1 | 8/2006 | Nemecek | 2001/0002129 A1 | 5/2001 | Zimmerman et al. | |
| 7,100,133 B1 | 8/2006 | Meiyappan et al. | 2001/0010083 A1 | 7/2001 | Satoh | |
| 7,103,108 B1 | 9/2006 | Beard | 2001/0038392 A1 | 11/2001 | Humpleman et al. | |
| 7,109,978 B2 | 9/2006 | Gillespie et al. | 2001/0043081 A1 | 11/2001 | Rees | |
| 7,117,485 B2 | 10/2006 | Wilkinson et al. | 2001/0044927 A1 | 11/2001 | Karniewicz | |
| 7,119,550 B2 | 10/2006 | Kitano et al. | 2001/0045861 A1 | 11/2001 | Bloodworth et al. | |
| 7,119,602 B2 | 10/2006 | Davis | 2001/0047509 A1 | 11/2001 | Mason et al. | |
| 7,124,376 B2 | 10/2006 | Zaidi et al. | 2002/0010716 A1 | 1/2002 | McCartney et al. | |
| 7,127,630 B1 | 10/2006 | Snyder | 2002/0016706 A1 | 2/2002 | Cooke et al. | |
| 7,129,793 B2 | 10/2006 | Gramegna | 2002/0023110 A1 | 2/2002 | Fortin et al. | |
| 7,129,873 B2 | 10/2006 | Kawamura | 2002/0042696 A1 | 4/2002 | Garcia et al. | |
| 7,132,835 B1 | 11/2006 | Arcus | 2002/0052729 A1 | 5/2002 | Kyung et al. | |
| 7,133,140 B2 | 11/2006 | Lukacs et al. | 2002/0059543 A1 | 5/2002 | Cheng et al. | |
| 7,133,793 B2 | 11/2006 | Ely et al. | 2002/0063688 A1 | 5/2002 | Shaw et al. | |
| 7,138,841 B1 | 11/2006 | Li et al. | 2002/0065646 A1 | 5/2002 | Waldie et al. | |
| 7,138,868 B2 | 11/2006 | Sanchez et al. | 2002/0068989 A1 | 6/2002 | Ebisawa et al. | |
| 7,139,530 B2 | 11/2006 | Kusbel | 2002/0073119 A1 | 6/2002 | Richard | |
| 7,141,968 B2 | 11/2006 | Hibbs et al. | 2002/0073380 A1 | 6/2002 | Cooke | |
| 7,141,987 B2 | 11/2006 | Hibbs et al. | 2002/0080186 A1 | 6/2002 | Frederiksen | |
| 7,149,316 B1 | 12/2006 | Kutz et al. | 2002/0085020 A1 | 7/2002 | Carroll, Jr. | |
| 7,150,002 B1 | 12/2006 | Anderson et al. | 2002/0099863 A1 | 7/2002 | Comeau et al. | |
| 7,151,528 B2 | 12/2006 | Taylor et al. | 2002/0109722 A1 | 8/2002 | Rogers et al. | |
| 7,152,027 B2 | 12/2006 | Andrade et al. | 2002/0116168 A1 | 8/2002 | Kim | |
| 7,154,294 B2 | 12/2006 | Liu et al. | 2002/0121679 A1 | 9/2002 | Bazarjani et al. | |
| 7,161,936 B1 | 1/2007 | Barrass et al. | 2002/0122060 A1 | 9/2002 | Markel | |
| 7,162,410 B1 | 1/2007 | Nemecek et al. | 2002/0129334 A1 | 9/2002 | Dane et al. | |
| 7,171,455 B1 | 1/2007 | Gupta et al. | 2002/0133771 A1 | 9/2002 | Barnett | |
| 7,176,701 B2 | 2/2007 | Wachi et al. | 2002/0133794 A1 | 9/2002 | Kanapathippillai et al. | |
| 7,178,096 B2 | 2/2007 | Rangan et al. | 2002/0138516 A1 | 9/2002 | Igra | |
| 7,180,342 B1 | 2/2007 | Shutt et al. | 2002/0144099 A1 | 10/2002 | Muro, Jr. et al. | |
| 7,185,162 B1 | 2/2007 | Snyder | 2002/0145433 A1 | 10/2002 | Morrise et al. | |
| 7,185,321 B1 | 2/2007 | Roe et al. | 2002/0152234 A1 | 10/2002 | Estrada et al. | |
| 7,188,063 B1 | 3/2007 | Snyder | 2002/0152449 A1 | 10/2002 | Lin | |
| 7,193,901 B2 | 3/2007 | Ruby et al. | 2002/0156885 A1 | 10/2002 | Thakkar | |
| 7,199,783 B2 | 4/2007 | Wenstrand et al. | 2002/0156998 A1 | 10/2002 | Casselman | |
| 7,200,507 B2 | 4/2007 | Chen et al. | 2002/0161802 A1 | 10/2002 | Gabrick et al. | |
| 7,206,733 B1 | 4/2007 | Nemecek | 2002/0166100 A1 | 11/2002 | Meding | |

| | | |
|---|---|---|
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025679 A1 | 2/2003 | Taylor et al. |
| 2003/0025734 A1 | 2/2003 | Boose et al. |
| 2003/0033588 A1 | 2/2003 | Alexander |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0063428 A1 | 4/2003 | Nishi |
| 2003/0066057 A1 | 4/2003 | RuDusky |
| 2003/0080755 A1 | 5/2003 | Kobayashi |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0128612 A1 | 7/2003 | Moore et al. |
| 2003/0135842 A1 | 7/2003 | Frey et al. |
| 2003/0149961 A1 | 8/2003 | Kawai et al. |
| 2003/0156098 A1 | 8/2003 | Shaw et al. |
| 2003/0160808 A1 | 8/2003 | Foote et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0169594 A1 | 9/2004 | Ely et al. |
| 2004/0178997 A1 | 9/2004 | Gillespie et al. |
| 2004/0205553 A1 | 10/2004 | Hall et al. |
| 2004/0205617 A1 | 10/2004 | Light |
| 2004/0205695 A1 | 10/2004 | Fletcher |
| 2004/0252109 A1 | 12/2004 | Trent, Jr. et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0066152 A1 | 3/2005 | Garey |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0097991 A1 | 5/2006 | Hotelling et al. |
| 2006/0113974 A1 | 6/2006 | Kan et al. |
| 2006/0158268 A1* | 7/2006 | McCorquodale et al. ...... 331/34 |
| 2006/0164142 A1 | 7/2006 | Stanley |
| 2006/0273804 A1 | 12/2006 | Delorme et al. |
| 2007/0139074 A1 | 6/2007 | Reblewski |
| 2007/0258458 A1 | 11/2007 | Kapoor |
| 2008/0086668 A1 | 4/2008 | Jefferson et al. |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0066427 A1 | 3/2009 | Brennan |
| 2009/0322305 A1 | 12/2009 | De Cremoux |

FOREIGN PATENT DOCUMENTS

| | | |
|---|---|---|
| EP | 0308583A2 A1 | 3/1989 |
| EP | 368398 A1 | 5/1990 |
| EP | 0450863A2 A1 | 10/1991 |
| EP | 0499383A2 A1 | 8/1992 |
| EP | 0639816A2 A1 | 2/1995 |
| EP | 11914232A2 A1 | 2/2001 |
| EP | 1170671A1 A1 | 1/2002 |
| EP | 1205848 A1 | 5/2002 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

Van Ess, David, "Simulating a 555 Timer with PSoC™," Cypress Semiconductor Corporation, Application Note AN2286, pp. 1-10, May 19, 2005.

Cypress Semiconductor Corporation, "FAN Controller CG6457AM and CG6462AM," PSoC™ Mixed-Signal Array Preliminary Data Sheet, pp. 1-25, May 24, 2005.

Cypress Semiconductor Corporation, "PsoC Mixed-Signal Controllers," Product Description, pp. 1-2, http://www.cypress.com/portal/server.pt?space=CommunityPage&control=SetCommunity&CommunityID=209&PageID=215&gid=13&fid=24&category=false. (Retrieved on Sep. 27, 2005).

Cypress Semiconductor Corporation, "CY8C21x34 Data Sheet," CSR User Module, CSR V.1.0, Oct. 6, 2005, pp. 1-36.

Chapweske, Adam, "The PS/2 Mouse Interface," PS/2 Mouse Interfacing, 2001.

Cypress Semiconductor Corporation, "Cypress Introduces PSoC(TM)-Based Capacitive Touch Sensor Solution", Cypress Press Release, May 31, 2005, http://www.cypress.com/portal/server.pt?space=CommunityPage&control=SetCommunity&CommunityID =208&PageID=218&DirectoryID=661552 (Retrieved on Feb. 5, 2007).

Seguine, Ryan, "Layout Guidelines for PSoC™ CapSense™," Cypress Semiconductor Corporation, Application Note AN2292, pp. 1-10, Jul. 22, 2005.

Lee, Mark, "EMC Design considerations for PsoC™ CapSense™ Applications," Cypress Semiconductor Corporation, Application Note AN2318, pp. 1-6, Sep. 16, 2005.

USPTO Notice of Allowance for U.S. Appl. No. 10/238,966 dated Jan. 27, 2009; 4 pages.

USPTO Non-Final Rejection for U.S. Appl. No. 10/238,966 dated Jun. 30, 2008; 12 pages.

USPTO Non-Final Rejection for U.S. Appl. No. 10/238,966 dated Dec. 26, 2007; 12 pages.

USPTO Final Rejection for U.S. Appl. No. 10/238,966 dated Sep. 27, 2007; 9 pages.

USPTO Non-Final Rejection for U.S. Appl. No. 10/238,966 dated Apr. 19, 2007; 7 pages.

USPTO Non-Final Rejection for U.S. Appl. No. 10/238,966 dated Oct. 20, 2006; 8 pages.

USPTO Non-Final Rejection for U.S. Appl. No. 10/238,966 dated Apr. 6, 2006; 8 pages.

USPTO Notice of Allowance for U.S. Appl. No. 10/033,027 dated Mar. 31, 2009; 7 pages.

USPTO Non-Final Rejection for U.S. Appl. No. 10/033,027 dated Dec. 18, 2008; 5 pages.

USPTO Final Rejection for U.S. Appl. No. 10/033,427 dated Jun. 8, 2007; 8 pages.

USPTO Non-Final Rejection for U.S. Appl. No. 10/033,027 dated Dec. 21, 2006; 31 pages.

USPTO Final Rejection for U.S. Appl. No. 10/033,027 dated Aug. 9, 2006; 6 pages.

USPTO Non-Final Rejection for U.S. Appl. No. 10/033,027 dated Apr. 26, 2006; 26 pages.

USPTO Final Rejection for U.S. Appl. No. 10/033,027 dated Oct. 31, 2005; 24 pages.

USPTO Non-Final Rejection for U.S. Appl. No. 10/033,027 dated Apr. 20, 2005; 20 pages.

USPTO Non-Final Rejection for U.S. Appl. No. 10/033,027 dated Oct. 18, 2004; 17 pages.

USPTO Non-Final Rejection for U.S. Appl. No. 10/001,478 dated Oct. 20, 2008; 18 pages.

USPTO Final Rejection for U.S. Appl. No. 10/001,478 dated Jun. 4, 2008; 18 pages.

USPTO Non-Final Rejection for U.S. Appl. No. 10/001,478 dated Jan. 30, 2008; 19 pages.

USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Notice of Allowance for U.S. Appl. No. 10/001,477 dated Nov. 10, 2008; 7 pages.
USPTO Advisory Action for U.S. Appl. No. 10/001,477 dated oct. 10, 2008; 3 pages.
USPTO Final Rejection for U.S. Appl. No. 10/001,477 dated Jun. 30, 2008; 15 pages.
USPTO Non-Final Rejection for U.S. Appl. No. 10/001,477 dated Dec. 6, 2007; 13 pages.
USPTO Final Rejection for U.S. Appl. No. 10/001,477 dated Jul. 23, 2007; 16 pages.
USPTO Non-Final Rejection for U.S. Appl. No. 10/001,477 dated Jan. 22, 2007; 15 pages.
USPTO Final Rejection for U.S. Appl. No. 10/001,477 dated Aug. 24, 2006; 13 pages.
USPTO Non-Final Rejection for U.S. Appl. No. 10/001,477 dated Mar. 2, 2006; 14 pages.
USPTO Final Rejection for U.S. Appl. No. 10/001,477 dated Oct. 24, 2005; 13 pages.
USPTO Non-Final Rejection for U.S. Appl. No. 10/001,477 dated May 11, 2005; 10 pages.
"Micropower CMOS Temperature Sensor with Digital Output;" Bakker et al., IEEE Journal of Solid-State Circuits, 1996; 3 pages.
"WP 3.5: An Integrated Time Reference;" Blauschild, Digest of Technical Papers, 1994; 4 pages.
"An Analog PPL-Based Clock and Data Recovery Circuit with High Input Jitter Tolerance;" Sun, Reprinted from IEEE Journal of Solid-State Circuits, 1989; 4 pages.
U.S. Appl. No. 09/842,966: "Precision Crystal Oscillator Circuit Used in Microcontroller," Mar, 28 pages.
U.S. Appl. No. 09/964,991: "A Novel Sand-Gap Circuit for Providing an Accurate Reference Voltage Compensated for Process State, Process Variations and Temperature," Kutz et al.; 25 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975;115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Aug. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages.
U.S. Appl. No. 10/238,966: "Method for Parameterizing a User Module;" Perrin; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 5, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.

USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912; "Circuit(s), Architecture and Method(s) for Operating and/or Tuning a Ring Oscillator;" Mar; 23 pages.
USPTO Notice of Allowance for U.S. Appl. No. 10/001,477 dated May 8, 2009; 6 pages.
From Application No. 10/033,027 (CD00232): Goodenough, F. "Analog Counterparts of Fpgas Ease System Design" Electronic Design, Penton Publishing, Cleveland, Oh, US vol. 42, no. 21, 10/14/94, 10 pages.
From U.S. Appl. No. 10/033,027: Harbaum, T. et al. "Design of a Flexible Coprocessor Unit" Proceedings of the Euromicro Conference, XX Xx, Sep. 1999; 10 pages.
From U.S. Appl. No. 10/033,027; "Programmable Microcontroller (PSoC) Architecture (Mixed Analog/Digital)" Aug. 7, 2001; U.S. Appl. No. 09/924,734 Snyder et al.; 28 pages.
From U.S. Appl. No. 10/033,027; "Digital Configurable Macro Architecture"; Jul. 18, 2001; U.S . Appl. No. 09/909,045; Snyder: 37 pages.
From U.S. Appl. No. 10/033,027: "Configuring Digital Functions in a Digital Configurable Macro Architecture"; Jul. 18, 2001; U.S. Appl. No. 09/909,109; Snyder; 38 pages.
From U.S. Appl. No. 10/033,027: "A Programmable Analog System Architecture (As Amended)"; Jul. 18, 2001; U.S. Appl. No. 09/909,047; Mar; 60 pages.
From U.S. Appl. No. 10/033,027: "Programmable Methodology and Architecture for a Programmable Analog System (As Amended)"; Aug. 14, 2001; U.S. Appl. No. 09/930,021; Mar et al.; 87 pages.
From U.S. Appl. No. 10/033,027: "Method for Synchronizing and Resetting Clock Signals Supplied to Multiple Programmable Analog Blocks (As Amended)"; Oct. 1, 2001; U.S. Appl. No. 09/969,311; Sullam; 57 pages.
From U.S. Appl. No. 10/033,027: "Method and Apparatus for Programming a Flash Memory"; Jun. 5, 2001; U.S. Appl. No. 09/875,599; Snyder; 23 pages.
From U.S. Appl. No. 10/033,027: "In-System Chip Emulator Architecture"; Oct. 10, 2001; U.S. Appl. No. 09/975,115; Snyder et al.; 38 pages.
From U.S. Appl. No. 10/033,027: "A Configurable Input/Output Interface for a Microcontroller"; Sep. 14, 2001; U.S. Appl. No. 09/953,423; Kutz et al.; 28 pages.
From U.S. Appl. No. 10/033,027: "Multiple Use of Microcontroller Pad"; Jun. 26, 2001; U.S. Appl. No. 09/893,050; Kutz et al.; 21 pages.
From U.S. Appl. No. 10/033,027: "Programming Architecture for a Programmable Analog System"; Aug. 14, 2001; U.S. Appl. No. 09/929,891; Mar et al.; 82 pages.
From U.S. Appl. No. 10/033,027: "Architecture for Synchronizing and Resetting Clock Signals Supplied to Multiple Analog Programmable Blocks"; Oct. 1, 2001; U.S. Appl. No. 09/969,313; Sullam; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al.; "Microcontrollers", 1992, McGraw-Hill; 11 pages.
Ganapathy, Gopi , and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
The Provisional U.S. Appl. No. 60/243,708 "Advanced Programmable Microcontroller Device"; 277 pages.
"Webster's Third New International Dictionary", 1996, G. & C. Merriam Company; 3 pages.
USPTO Advisory Action for U.S. Appl. No. 09/998,848 dated Sep. 7, 2005; 3 pages.
U.S. Appl. No. 091957,084: "A Crystal-Less Oscillator with Trimmable Analog Current Control for Increased Stability:" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode:" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868: "Protecting Access to Microcontroller Memory Blocks;" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an in-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System:" Nemecek; 43 pages.
U.S. Appl. No. 10/001,568: "Combined In-Circuit Emulator and Programmer;" Nemecek; 47 pages.
U.S. Appl. No. 10/001,478: "In-Circuit Emulator and POD Synchronized Boot;" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable;" Shutt; 33 pages.
U.S. Appl. No. 09/922,419: "A Power Supply Pump Circuit for a Microcontroller;" Kutz; 38 pages.
U.S. Appl. No. 09/922,579: "A Method for a Efficient Supply to a Microcontroller;" Kutz; 37 pages.
U.S. Appl. No. 09/923,461: "Non-Interfering Multiply-Mac (Multiply Accumulate) Circuit;" Snyder; 25 pages.
U.S. Appl. No. 09/935,454: "Method and Apparatus for Local and Global Power Management in a Programmable Analog Circuit;" Mar; 51 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
Bursky, "FPGA Combines Multiple Interfaces and Logic," Electronic Design, vol. 48 No. 20, pp. 74-78 (Oct. 2, 2000); 5 pages.

Anonymous, "Warp Nine Engineering—The IEEE 1284 Experts-F/Port Product Sheet," undated web page found at http://wvvw.fapo.com/fport.htm; 2 pages.

Anonymous, "F/Port:Fast Parallel Port for the PC" Installation Manual Release 7.1, circa 1997, available for download from http://www.fapo.com/fport.htm; 25 pages.

Nam et al.; "Fast Development of Source-Level Debugging System Using Hardware Emulation"; IEEE 2000; 4 pages.

Huang et al.; "Iceberg: An Embedded In-Cicuit Emulator Synthesizer for Microcontrollers"; ACM 1999; 6 pages.

Khan et al.; "FPGA Architectures for Asic Hardware Emulators"; IEEE 1993; 5 pages.

Oh et al.; Emulator Environment Based on an FPGA Prototyping Board; IEEE 21-23; Jun. 2000; 6 pages.

Hong et al,; "An FPGA-Based Hardware Emulator for Fast Fault Emulation"; IEEE 1997; 4 pages.

Ching et al.; "An In-Curcuit-Emulator for TMS320C25"; IEEE 1994; 6 pages.

Pasternak; "In-Circuit-Emulation in ASIC Architecture Cor Designs"; IEEE 1989; 4 pages.

Melear; "Using Background Modes for Testing, Debugging and Emulation of Microcontrollers"; IEEE 1997; 8 pages.

Walters, Stephen; "Computer-Aided Prototyping for ASIC-Based Systems", 1991, IEEE Design & Test of Computers; vol. 8, Issue 2; 8 pages.

Anonymous; "JEEN JTAG Embedded Ice Ethernet Interface"; Aug. 1999; Embedded Performance, Inc.; 3 pages.

Sedory; "A Guide to Debug"; 2004; retrieved on May 20, 2005; 7 pages.

"Microsoft Files Summary Judgement Motions"; Feb. 1999; Microsoft PressPass; retrieved on May 20, 2005 from http://wvvw.microsoft.com/presspass/press/1999/feb99/Feb99/Calderapr.asp; 3 pages.

Xerox; "Mesa Debugger Documentation"; Apr. 1979; Xerox Systems Development Department Version 5.0; 33 pages.

Stallman et al.; "Debugging with the GNU Source-Level Debugger"; Jan. 1994; retrieved on May 2, 2005 from http://www.cs.utah.edu; 4 pages.

Wikipedia.org; "Von Neumann architecture"; retrieved from http://en.wikipedia.org/wiki/Von_Neumann_architecture on Jan. 22, 2007; 4 pages.

Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm, 2 pages.

"POD—Piece of Data, Plain Old Documentation, Plain Old Dos . . ."; retrieved on Nov. 14, 2005 from http://www.auditmypc.comiacronym/POD.asp; 2 pages.

USPTO Non-Final Rejection for U.S. Appl. No. 09/989,767 dated Oct. 6, 2004; 15 pages.

USPTO Final Rejection for U.S. Appl. No. 09/989,771 dated Feb. 27, 2007; 8 pages.

USPTO Final Rejection for U.S. Appl. No. 09/989,771 dated Mar. 28, 2006; 9 pages.

USPTO Final Rejection for U.S. Appl. No. 09/989,771 dated Apr. 6, 2005; 7 pages.

USPTO Final Rejection for U.S. Appl. No. 09/989,771 dated Dec. 10, 2008; 12 pages.

USPTO Final Rejection for U.S. Appl. No. 09/989,771 dated Dec. 27, 2007; 15 pages.

USPTO Non-Final Rejection for U.S. Appl. No. 09/989,771 dated May 28, 2008; 14 pages.

USPTO Non-Final Rejection for U.S. Appl. No. 09/989,771 dated Jul. 16, 2007; 14 pages.

USPTO Non-Final Rejection for U.S. Appl. No. 09/989,771 dated Aug. 23, 2006; 7 pages.

USPTO Non-Final Rejection for U.S. Appl. No. 09/989,771 dated Sep. 12, 2005; 7 pages.

USPTO Non-Final Rejection for U.S. Appl. No. 09/989,771 dated Sep. 22, 2004; 7 pages.

USPTO Final Rejection for U.S. Appl. No. 09/989,765 dated Apr. 3, 2007; 12 pages.

USPTO Final Rejection for U.S. Appl. No. 09/989,765 dated Apr. 4, 2008; 16 pages.

USPTO Final Rejection for U.S. Appl. No. 09/989,765 dated Apr. 17, 2006; 12 pages.

USPTO Non-Final Rejection for U.S. Appl. No. 09/989,765 dated Sep. 19, 2007; 14 pages.

USPTO Non-Final Rejection for U.S. Appl. No. 09/989,765 dated Sep. 26, 2008; 17 pages.

USPTO Non-Final Rejection for U.S. Appl. No. 09/989,765 dated Oct. 2, 2006; 13 pages.

USPTO Non-Final Rejection for U.S. Appl. No. 09/989,765 dated Oct. 5, 2005; 9 pages.

USPTO Final Rejection for U.S. Appl. No. 09/989,782 dated Jul. 9, 2008; 10 pages.

USPTO Final Rejection for U.S. Appl. No. 09/989,782 dated Jul. 24, 2007; 9 pages.

USPTO Final Rejection for U.S. Appl. No. 09/989,782 dated Sep. 21, 2006; 10 pages.

USPTO Final Rejection for U.S. Appl. No. 09/989,782 dated Nov. 3, 2005; 11 pages.

USPTO Non-Final Rejection for U.S. Appl. No. 09/989,782 dated Jan. 29, 2007; 9 pages USPTO Non-Final Rejection for U.S. Appl. No. 09/989,782 dated Mar. 28, 2006; 8 pages.

USPTO Non-Final Rejection for U.S. Appl. No. 09/989,782 dated Apr. 29, 2005; 11 pages.

USPTO Non-Final Rejection for U.S. Appl. No. 09/989,782 dated Oct. 6, 2004; 11 pages.

USPTO Non-Final Rejection for U.S. Appl. No. 09/989,782 dated Nov. 26, 2008; 10 pages.

USPTO Non-Final Rejection for U.S. Appl. No. 09/989,782 dated Dec. 14, 2007; 8 pages.

USPTO Final Rejection for U.S. Appl. No. 09/989,765 dated Mar. 31, 2009; 18 pages.

USPTO Final Rejection for U.S. Appl. No. 09/989,778 dated Mar. 16, 2009; 26 pages.

"Pod-Wikipedia, the free encyclopedia"; retrieved on Nov. 14, 2005 from http://en.wikipedia.org/wiki/Pod; 3 pages.

"pod-defintion by dict.die.net"; retrieved on Nov. 14, 2005 from http:/dict.die.net/pod; 2 pages.

"In-Curcuit Emulators—descriptions of the major ICEs around"; retrieved on Nov. 14, 2005 from http://www.algonet.se/~staffann/developer/emulator.htm; 6 pages.

"Capturing Test/Emulation and Enabling Real-Time Debugging Using FPGA for In-Circuit Emulation;" Oct. 10,2001; U.S. Appl. No. 09/975,104; Snyder; 35 pages.

USPTO Non-Final Rejection for U.S. Appl. No. 09/989,767 dated Jul. 24, 2008; 21 pages.

Anonymous; "Using Debug"; 1999; Prentice-Hall Publishing; 20 pages.

Harrison et al.; "Xilinx FPGA Design in a Group Environment Using VHDS and Synthesis Tools"; Colloquium on Digital System Design Using Synthesis Techniques; Feb. 15, 1996; 4 pages..

Microsoft Press Computer User's Dictionary; 1998; 3 pages.

Sreeram Duvvuru and Siamak Arya, "Evaluation of a Branch Target Address Cache," 1995; IEEE; 8 pages.

Andrew S. Tanenbaum with contributions from James R. Goodman, "Structured Computer Organization," 1999, Prentice Hall, Fourth Edition; 32 pages.

"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.

"Emulator Chip-Board Architecture for Interface;" Oct. 10, 2001; U.S. Appl. No. 09/975,030; Snyder et al.; 37 pages.

Wikipedia—Main Page, retrieved on Mar. 8, 2006 from http://en.wikipedia.org/wiki/Main_Page and http://en.wikipedia.org/wiki/Wikipedia:Introduction; 5 pages.

Wikipedia—Processor register, retrieved on Mar. 7, 2006 from http://en.wikipedia.org/wki/Processor_register; 4 pages.

Jonathan B. Rosenburg, "How Debuggers Work" John Wiley & Sons, Inc. 1996; 259 pages.

Dahl, et al.; "Emulation of the Sparcle Microprocessor with the MIT Virtual Wires Emulation System"; 1994; IEEE; 9 pages.

Bauer et al.; "A Reconfigurable Logic Machine for Fast Event-Driven Simulation"; 1998; Design Automation Conference Proceedings; 8 pages.

"Host to FPGA Interface in an In-Circuit Emulation System;" Oct. 10, 2001; U.S. Appl. No. 09/975,105; Nemecek; 44 pages.

USPTO Advisory Action for U.S. Appl. No. 09/994,601 dated May 23, 2006; 3 pages.

USPTO Non-Final Rejection for U.S. Appl. No. 09/994,601 dated Jul. 29, 2004; 10 pages.

USPTO Ex Parte Qualyle Action for U.S. Appl. No. 09/992,076 dated Jun. 18, 2007; 6 pages.

USPTO Non-Final Rejection for U.S. Appl. No. 09/992,076 dated Aug. 10, 2006; 19 pages.

USPTO Notice of Allowance for U.S. Appl. No. 09/992,076 dated Mar. 26, 2008; 23 pages.

USPTO Notice of Allowance for U.S. Appl. No. 09/992,076 dated Jul. 29, 2008; 6 pages.

UPSTO Advisory Action for U.S. Appl. No. 09/989,778 dated May 15, 2006; 4 pages.

USPTO Final Rejection for U.S. Appl. No. 09/989,778 dated Jan. 8, 2009; 25 pages.

USPTO Final Rejection for U.S. Appl. No. 09/989,778 dated Feb. 5, 2007; 17 pages.

USPTO Final Rejection for U.S. Appl. No. 09/989,778 dated Feb. 15, 2006; 9 pages.

USPTO Final Rejection for U.S. Appl. No. 09/989,778 dated Dec. 20, 2007; 14 pages.

USPTO Non-Final Rejection for U.S. Appl. No. 09/989,778 dated Mar. 29, 2005; 14 pages.

USPTO Non-Final Rejection for U.S. Appl. No. 09/989,778 dated Jul. 14, 2008; 24 pages.

USPTO Non-Final Rejection for U.S. Appl. No. 09/989,778 dated Jul. 19, 2007; 18 pages.

USPTO Non-Final Rejection for U.S. Appl. No. 09/989,778 dated Sep. 1, 2005; 10 pages.

USPTO Non-Final Rejection for U.S. Appl. No. 09/989,778 dated Sep. 18, 2006; 11 pages.

USPTO Final Rejection for U.S. Appl. No. 09/998,848 dated Jun. 14, 2005; 17 pages.

USPTO Final Rejection for U.S. Appl. No. 09/998,848 dated Jul. 25, 2006; 16 pages.

USPTO Final Rejection for U.S. Appl. No. 09/998,848 dated Aug. 10, 2007; 14 pages.

USPTO Final Rejection for U.S. Appl. No. 09/998,848 dated Nov. 24, 2008; 15 pages.

USPTO Non-Final Rejection for U.S. Appl. No. 09/998,848 dated Jan. 26, 2006; 17 pages.

USPTO Non-Final Rejection for U.S. Appl. No. 09/998,848 dated Jan. 29, 2007; 13 pages.

USPTO Non-Final Rejection for U.S. Appl. No. 09/998,848 dated Feb. 22, 2008; 15 pages.

USPTO Non-Final Rejection for U.S. Appl. No. 09/998,848 dated Dec. 21, 2004; 14 pages.

USPTO Final Rejection for U.S. Appl. No. 09/989,767 dated Jan. 11, 2007; 12 pages.

USPTO Final Rejection for U.S. Appl. No. 09/989,767 dated Jan. 15, 2009; 21 pages.

USPTO Final Rejection for U.S. Appl. No. 09/989,767 dated Mar. 6, 2006; 15 pages.

USPTO Final Rejection for U.S. Appl. No. 09/989,767 dated Apr. 6, 2005; 13 pages.

USPTO Final Rejection for U.S. Appl. No. 09/989,767 dated Dec. 27, 2007; 21 pages.

USPTO Non-Final Rejection for U.S. Appl. No. 09/989,767 dated Jul. 17, 2006; 12 pages.

USPTO Non-Final Rejection for U.S. Appl. No. 09/989,767 dated Jul. 2, 2007; 22 pages.

USPTO Notice of Allowance for U.S. Appl. No. 09/992,076 dated Nov. 13, 2008; 15 pages.

USPTO Final Rejection for U.S. Appl. No. 09/994,601 dated May 18, 2007; 17 pages.

USPTO Notice of Allowance for U.S. Appl. No. 09/992,076 dated Nov. 29, 2007; 8 pages.

USPTO Final Rejection for U.S. Appl. No. 09/992,076 dated Jan. 30, 2007; 32 pages.

USPTO Non-Final Rejection for U.S. Appl. No. 09/992,076 dated Aug. 10, 2006; 19 pages.

USPTO Final Rejection for U.S. Appl. No. 09/992,076 dated Mar. 17, 2006; 16 pages.

USPTO Non-Final Rejection for U.S. Appl. No. 09/992,076 dated Nov. 21, 2005; 29 pages.

USPTO Non-Final Rejection for U.S. Appl. No. 09/992,076 dated Jun. 1, 2005; 20 pages.

USPTO Notice of Allowance for U.S. Appl. No. 09/994,600 dated Nov. 12, 2008; 35 pages.

USPTO Notice of Allowance for U.S. Appl. No. 09/994,600 dated May 14, 2008; 22 pages.

USPTO Final Rejection for U.S. Appl. No. 09/994,600 dated Oct. 17, 2007; 13 pages.

USPTO Non-Final Rejection for U.S. Appl. No. 09/994,600 dated May 15, 2007; 14 pages.

USPTO Final Rejection for U.S. Appl. No. 09/994,600 dated Dec. 8, 2006; 14 pages.

USPTO Non-Final Rejection for U.S. Appl. No. 09/994,600 dated Jul. 17, 2006; 14 pages.

USPTO Final Rejection for U.S. Appl. No. 09/994,600 dated Feb. 13, 2006; 13 pages.

USPTO Non-Final Rejection for U.S. Appl. No. 09/994,600 dated Aug. 23, 2005; 13 pages.

USPTO Final Rejection for U.S. Appl. No. 09/994,600 dated May 4, 2005; 16 pages.

USPTO Non-Final Rejection for U.S. Appl. No. 09/994,600 dated Oct. 21, 2004; 37 pages.

USPTO Notice of Allowance for U.S. Appl. No. 10/001,477 dated Nov. 10, 2008; 13 pages.

USPTO Final Rejection for U.S. Appl. No. 10/001,477 dated Jun. 30, 2008; 19 pages.

USPTO Non-Final Rejection for U.S. Appl. No. 10/001,477 dated Dec. 6, 2007; 17 pages.

USPTO Final Rejection for U.S. Appl. No. 10/001,477 dated Jul. 23, 2007; 19 pages.

USPTO Non-Final Rejection for U.S. Appl. No. 10/001,477 dated Jan. 22, 2007; 17 pages.

USPTO Final Rejection for U.S. Appl. No. 10/001,477 dated Aug. 24, 2006; 15 pages.

USPTO Non-Final Rejection for U.S. Appl. No. 10/001,477 dated Mar. 2, 2006; 17 pages.

USPTO Final Rejection for U.S. Appl. No. 10/001,477 dated Oct. 24, 2005; 18 pages.

USPTO Non-Final Rejection for U.S. Appl. No. 10/001,477 dated May 11, 2005; 31 pages.

Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.

Julio Faura et al.; "A Novel Mixed Signal Programmable Device With On-Chip Microprocessor", 1997, IEEE 1997 Custom Integrated Circuits Conference; 4 pages.

Monte Mar, Bert Sullam, Eric Blom; "An architecture for a configurable Mixed-signal device", 2003, IEEE Journal of Solid-State Circuits, vol. 3; 4 pages.

Robinson, Gordon D; "Why 1149.1 (JTAG) Really Works", May 1994, Conference Proceedings Electro/94 International, May 10-12, 1994, Combined Volumes; 6 pages.

USPTO Non-Final Rejection for U.S. Appl. No. 09/994,601 dated Oct. 4, 2007; 20 pages.

"PSoC designer: Integrated development environment, getting started 25-minute tutorial, version 1.0", Cypress Microsystems, Cypress Microsystems, Inc. CMS10006A, Jul. 3, 2001; 25 pages.

"PSoC technology complete changes 8-bit MCU system design", Cypress Microsystems, Inc. retrieved from <http>://www.archive.org/web/20010219005250/http://cypressmicro.com-/t . . .>, Feb. 19, 2001; 21 pages.

Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.

Hsieh et al,, "Modeling Micro-Controller Peripherals for High-Level Co-Simulation and Synthesis," IEEE, 1997; 4 pages.

USPTO Notice of Allowance for U.S. Appl. No. 09/989,777 dated Nov. 4, 2008; 3 pages.

USPTO Notice of Allowance for U.S. Appl. No. 09/989,777 dated Sep. 15, 2008; 28 pages.

USPTO Notice of Allowance for 09/989,777 dated Jul. 7, 2008; 23 pages.

USPTO Final Rejection for U.S. Appl. No. 09/989,777 dated Jan. 30, 2008; 14 pages.

USPTO Non-Final Rejection for U.S. Appl. No. 09/989,777 dated Sep. 11, 2007; 18 pages.

USPTO Final Rejection for U.S. Appl. No. 09/989,777 dated Mar. 13, 2007; 24 pages.

USPTO Non-Final Rejection for U.S. Appl. No. 09/989,777 dated Sep. 13, 2006; 18 pages.

USPTO Non-Final Rejection for U.S. Appl. No. 09/989,777 dated Apr. 11, 2006; 21 pages.

USPTO Final Rejection for U.S. Appl. No. 09/989,777 dated Dec. 21, 2005; 29 pages.

USPTO Non-Final Rejection for U.S. Appl. No. 09/989,777 dated Jul. 5, 2005; 36 pages.

USPTO Notice of Allowance for U.S. Appl. No. 09/994,601 dated Dec. 22, 2008; 15 pages.

USPTO Final Rejection for U.S. Appl. No. 09/994,601 dated Apr. 17, 2008; 24 pages.

U.S. Appl. No. 10/033,027: "Microcontroltable Programmable System on a Chip;" Snyder; 117 pages.

U.S. Appl. No. 10/803,030: "Programmable MicrocontroHable Architecture (Mixed Analog/Digital);" Snyder; 13 pages.

"New Object Domain R3 Beta Now Available (Build 134)!" Mar. 13, 2001; <http://web.archive.org/web/200100331202605/www.objectdomain.com/domain30/index.html>; 2 pages.

"OMG XML Metadata Interchange (XMI) Specifications" 2000; 17 pages.

Electronic Tools Company; E-Studio User Manuel; 2000; retrieved from http://web.archive.org for site http://e-tools.com on Mar. 23, 2005; 77 pages.

Cover Pages Technology Reports; XML and Electronic Design Automation (EDA); Aug. 2000; retrieved from http://xml.coverpages.org on Mar. 23, 2005; 5 pages.

Microsoft Computer Dictionary "ActiveX" 2002; Microsoft Press; 5th Edition; 3 pages.

Wikipedia "XLM" retrieved on Jan. 29, 2007 from http://en.wikipedia.org/wiki/XML; 16 pages.

"VHDL Samples" retrieved on Jan. 29, 2007 from http://www.csee.umbc.edu/help/VHDL/samples/samples.shtml; 10 pages.

Anonymous, "Lotus Notes FAQ—How do you generate unique document numbers?" Sep. 19, 1999; retrieved from www.keysolutions.com on Jul. 9, 2008; 1 page.

Ashok Bindra, "Programmable SoC Delivers a New Level of System Flexibility"; Electronic Design; Nov. 6, 2000; 11 pages.

Cypress MicroSystem, Inc. "Cypres Customer Forums" retrieved from <http://wwwcypress.com/forums/messageview>; 1 page.

Cypress MicroSystem, Inc. "PscC Designer: Integrated Development Environment User Guide"; Rev. 1.18; Sep. 8, 2003; 193 pages.

Hamblen, "Rapid Prototyping Using Field-Programmable Logic Devices" Jun. 2000, IEEE; 9 pages.

USPTO Final Rejection for U.S. Appl. No. 09/943,062 dated Apr. 30, 2004; 9 pages.

Snyder at al., "Xilinx's A-to-Z Systems Platform" Cahners Microprocessor, The Insider's Guide to Microprocessor Hardware, Feb. 6, 2001; 6 pages.

"PSoC Technology Completely Changes 8-bit MCU System Design" Cypress MicroSystem, Inc. Feb. 19, 2001; 21 pages.

USPTO Non-Final Rejection for U.S. Appl. No. 09/943,062 dated Dec. 8, 2003; 9 pages.

USPTO Advisory Action for U.S. Appl. No. 09/943,062 dated Sep. 25, 2003; 3 pages.

USPTO Final Rejection for U.S. Appl. No. 09/943,062 dated Jun. 27, 2003; 8 pages.

USPTO Non-Final Rejection for U.S. Appl. No. 091943,062 dated Jan. 27, 2003; 7 pages.

USPTO Non-Final Rejection for U.S. Appl. No. 09/943,062 dated Sep. 11, 2002; 9 pages.

"PSoC Designer: Integrated Development Environment" User Guide; Revision 1.11; Last Revised Jul. 17, 2001; 109 pages.

Cypress Microsystems, "Cypress Microsystems Unveils Programmable System-on-a-Chip for Embedded Internet, Communications and Consumer Systems;" 2000, <http://www.cypressmicro.com/corporate/CY_Announces_nov_13_2000.html; 3 pages.

Huang et al., ICEBERG, An Embedded In-Circuit Emulator Synthesizer for Microcontrollers, Proceedings of the 36th Design Automation Conference 1999; 6 pages.

Yoo et al., "Fast Hardware-Software Co-verification by Optimistic Execution of Real Processor," Proceedings of Design, Automation and Test in Europe Conference and Exhibition 2000; 6 pages.

USPTO Advisory Action for U.S. Appl. No. 09/943,062 dated Mar. 27, 2008; 3 pages.

USPTO Final Rejection for U.S. Appl. No. 09/943,062 dated Jan. 18, 2008; 8 pages.

USPTO Non-Final Rejection for U.S. Appl. No. 09/943,062 dated Jun. 22, 2007; 12 pages.

USPTO Miscellaneous Action for U.S. Appl. No. 09/943,062 dated Jan. 30, 2006; 2 pages.

USPTO Notice of Allowance for U.S. Appl. No. 10/113,064 dated Sep. 21, 2006; 7 pages.

USPTO Non-Final Rejection for U.S. Appl. No. 10/113,064 dated Apr. 6, 2006; 19 pages.

USPTO Final Rejection for U.S. Appl. No. 10/113,064 dated Oct. 18, 2005; 22 pages.

USPTO Non-Final Rejection for U.S. Appl. No. 10/113,064 dated Apr. 25, 2005; 15 pages.

U.S. Appl. No. 10/113,064: "Method and System for Debugging through Supervisory Operating Codes and Self Modifying Codes," Roe et al.; 36 pages.

USPTO Notice of Allowance for U.S. Appl. No. 09/930,021 dated Nov. 26, 2004; 4 pages.

USPTO Final Rejection for U.S. Appl. No. 09/930,021 dated Aug. 31, 2004; 8 pages.

USPTO Non-Final Rejection for U.S. Appl. No. 09/930,021 dated Apr. 26, 2004; 6 pages.

USPTO Miscellaneous Action with SSP for U.S. Appl. No. 09/930,021 dated Oct. 1, 2001; 1 page.

USPTO Notice of Allowance for U.S. Appl. No. 09/953,423 dated Jul. 12, 2004; 6 pages.

USPTO Non-Final Rejection for U.S. Appl. No. 09/953,423 dated Feb. 6, 2004; 5 pages.

USPTO Notice of Allowance for U.S. Appl. No. 09/957,084 dated May 18, 2004; 5 pages.

USPTO Final Rejection for U.S. Appl. No. 09/957,084 dated Jan. 29, 2004; 8 pages.

USPTO Non-Final Rejection for U.S. Appl. No. 09/957,084 dated Aug. 27, 2003; 8 pages.

USPTO Final Rejection for U.S. Appl. No. 09/957,084 dated Apr. 23, 2003; 8 pages.

USPTO Non-Final Rejection for U.S. Appl. No. 09/957,084 datedAug. 23, 2002; 6 pages.

USPTO Notice of Allowance for U.S. Appl. No. 09/969,313 dated Oct. 4, 2005; 6 pages.

USPTO Non-Final Rejection for U.S. Appl. No. 09/969,313 dated May 6, 2005; 9 pages.

USPTO Requirement for Restriction/Election for U.S. Appl. No. 09/969,313 dated Mar. 18, 2005; 6 pages.

USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.

USPTO Advisory Action for U.S. Appl. No. 09/969,311 dated Jul. 21, 2003; 2 pages.

USPTO Final Rejection for U.S. Appl. No. 09/969,311 dated Apr. 7, 2003; 7 pages.

USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,1599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl/ No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 3dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.

USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.

USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
U.S. Appl. No. 09/989,815; "A Data Driven Method and System for Monitoring Hardware Resource Usage for Programming an Electric Device:" Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between and Ice and a Production Microcontroller while in a Halt State;" Nemecek; 33 pages.
U.S. Appl. No. 10/113,065: "System and Method for Automatically Matching Components in a Debugging System:" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
U.S. Appl. No. 11/850,260: "Circuit and Method for Improving the Accuracy of a Crystal-less Oscillator Having Dual-Frequency Modes;" Wright et al.; 33 pages.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.

USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894: "Open Loop Bandwidth Test Architecture and Method for Phase Locked Loop (PLL)," Stiff; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589: "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-Vdd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
U.S. Appl. No. 10/871,582: "LVDS Input Circuit with Extended Common Mode Range," Reinschmidt et al.; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
U.S. Appl. No. 09/404,891: "Method, Architecture and Circuitry for Controlling Pulse Width in a Phase and/or Frequency Detector," Scott et al.; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
Application No. 10/226,911 (CD02112): "Calibration of Integrated Circuit Time Constants," Gehring et al.; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 09/943,149: "Method for Phase Locking in a Phase Lock Loop," Moyal et al.; 21 pages.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.
U.S. Appl. No. 09/471,914: "Reference-Free Clock Generator and Data Recovery PLL," Dalmia et al.; 32 pages.
U.S. Appl. No. 09/471,576: "Reference-Free Clock Generation and Data Recovery PLL," Dalmia; 30 pages.
U.S. Appl. No. 10/083,442: "Method/Architecture for a Low Gain PLL with Wide Frequency Range," Meyers et al.; 28 pages.
U.S. Appl. No. 09/470,665: "Digital Phase/Frequency Detector, and Clock Generator and Data Recovery PLL Containing the Same," Dalmia; 26 pages.
U.S. Appl. No. 09/893,161: "Architecture of a Pll with Dynamic Frequency Control on a PLD," Moore; 32 pages.
U.S. Appl. No. 09/608,753: "PLL Lockout Watchdog," Wilson et al.; 24 pages.
U.S. Appl. No. 09/398,956: "Frequency Acquisition Rate Control in Phase Lock Loop Circuits," Moyal et al.; 35 pages.
U.S. Appl. No. 09/747,262: "Linearized Digital Phase-Locked Loop," Williams et al.; 9 pages.
U.S. Appl. No. 09/981,448: "Oscillator Tuning Method," Hauck; 28 pages.
U.S. Appl. No. 09/538,989: "Memory Based Phase Locked Loop," Krishnan; 27 pages.
U.S. Appl. No. 09/048,905: "Programmable Clock Generator," Mann et al.; 42 pages.
U.S. Appl. No. 08/865,342: "Programmable Clock Generator," Mann et al.; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004: 6 pages.

USPTO Non-Final Rejection for U.S. Appl. No. 10/288,003 dated Apr. 7, 2004; 9 pages.
U.S. Appl. No. 10/288,003: "Low Voltage Differential Signal Driver Circuit and Method," Roper et al.; 30 pages.
USPTO Notice of Allowance for U.S. Appl. No. 09/989,777 dated Jun. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922: "Design model for a hardware device-independent method of defining embedded firmware for programmable systems," McDonald et al.; 31 pages.
USPTO Non-Final Rejection for U.S. Appl. No. 11/201,627 dated Dec. 12, 2008; 17 pages.
USPTO Final Rejection for U.S. Appl. No. 11/201,827 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphical user interface," Ogami et al.; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets for microcontroller programming," Bartz et al.; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al.; 100 pages.
U.S. Appl. No. 09/979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al.; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.

U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac et al. "Symbolic Computation of Digital Filter Transfer Function Using MATLAB," Proceedings of 23rd International Conference on Microelectronics (MIEL 2002), vol. 2 NIS, Yugoslavia; 4 pages.
Nouta et al, "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12,2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition:" Jan. 16, 1997; <http://www.cs.sfu.ca/cs/people/GradStudent.html>; I page.
Ebeling et al., "Validating VLSI Circuit Layout by Wirelist Comparison:" Sep. 1983; in proceedings of the IEEE International Conference on Computer Aided Design (ICCAD-83); 2 pages.
"The Gemini Netlist Comparison Project" <http://www.cs.washington.edu/research/projects/lis/wvvw/gemini/gemini.html> larry@cs,washington.edu; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
U.S. Appl. No. 12/132,527: "System and Method for Performing Next Placements and Pruning of Disallowed Placements for Programming an Integrated Circuit" Ogami et al.; 44 pages.
U.S. Appl. No. 12/356,468: "System and Method for Dynamically Generating a Configuration Datasheet," Anderson et al.; filed on Jan. 20, 2009; 27 pages.
U.S. Appl. No. 11/273,708: "Capacitance Sensor Using Relaxation Oscillators," Snyder et al.; 33 pages.
USPTO Non-Final Rejection for Application No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
U.S. Appl. No. 11/337,272: "Successive Approximate Capacitance Measurement Circuit;" Snyder; 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.

USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
U.S. Appl. No. 11/983,291: "Successive Approximate Capacitance Measurement Circuit," Snyder; 26 pages.
USPTO Non-Final Rejection for U.S. Appl. No. 11/983,291 dated Mar. 9, 2009; 9 pages.
U.S. Appl. No. 11/698,660 "Configurable Bus," Kutz et al.; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor at al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami at al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the international Searching Authority for International Application No. PCT/US08/60681 (CD07139) dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the International Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for Application No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Final Rejection for U.S. Appl. No. 09/989,767 dated Dec. 7, 2009; 22 pages.

USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 11/698,660 dated 0211612010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2409; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2014; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Non-Final Rejection for U.S. Appl. No. 10/133,581 dated Feb. 24, 2006; 11 pages.
USPTO Non-Final Rejection for U.S. Appl. No. 10/133,581 dated Aug. 12, 2005; 12 pages .
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Non-Final Rejection for U.S. Appl. No. 12/132,527 dated Apr. 29, 2010; 7 pages.
USPTO Final Rejection for U.S. Appl. No. 11/818,005 dated May 24, 2010; 8 pages.
USPTO Notice of Allowance for U.S. Appl. No. 09/943,062 dated Jun. 29, 2010; 4 pages.
USPTO Non-final Rejection for U.S. Appl. No. 11/201,922 dated Jun. 11, 2010; 12 pages.
USPTO Non-Final Rejection for U.S. Appl. No. 12/070,647 dated Jun. 3, 2009; 6 pages.
USPTO Final Rejection for U.S. Appl. No. 12/070,547 dated Oct. 30, 2009; 5 pages.
USPTO Notice of Allowance for U.S. Appl. No. 12/070,547 dated Feb. 24, 2010; 4 pages.
USPTO Non-Final Rejection for U.S. Appl. No. 11/347,189 dated Jun. 8, 2007; 6 pages.
USPTO Notice of Allowance for U.S. Appl. No. 11/347,189 dated Sep. 27, 2007; 4 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jun. 26, 2008; 11 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.

USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 101327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004: 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Mooris Mano, "Computer System Architecture," 1982, Prentice-Hall, 2nd Edition pp. 261-264 and 435-440; 14 pages.
Dirk Killat, "A One-Chip Solution for Electronic Ballasts in Fluorescent Lamps," Power Electronics, <http://povverelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.comitibrary/print/0804/eady169/2.htm>; 4 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
U.S. Appl. No. 12/058,586: "System and Method for Monitoring a Target Device," Ogami et al., filed on Mar. 28, 2008; 41 pages.
U.S. Appl. No. 12/058,534: "System and Method for Controlling a Target Device," Ogami et al., filed on Mar. 28, 2008; 40 pages.
U.S. Appl. No. 12/004,833: "Systems and Methods for Dynamically Reconfiguring a Programmable System on a Chip," Ogami et al., filed on Dec. 21, 2007; 40 pages.
U.S. Appl. No. 12/058,569: "Configuration of Programmable IC Design Elements," Best et al., filed on Mar. 28, 2008; 19 pages.
U.S. Appl. No. 12/057,149: "Power Management Architecture, Method and Configuration System," Kenneth Ogami, filed on Mar. 27, 2008: 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010. 22 pages.
John Mangino, "Using DMA with High Performance Peripherals to Maximize System Performance," 2007, Texas Instruments, pp. 1-23: 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 2001, 2004, National Instruments Corporation, pp. 1-19; 19 pages.
Vixel, "InSpeed SOC 320 Embedded Storage Switch," 2003, Vixel, pp. 1-5; 5 pages.
USPTO Notice of Allowance for U.S. Appl. No. 09/943,062 dated Jun. 29, 2010; 4 pages.
USPTO Miscellaneous Action for U.S. Appl. No. 10/113,581 dated Jun. 23, 2010; 6 pages.
USPTO Micellaneous Action for U.S. Appl. No. 10/001,478 dated Feb. 23, 2010; 5 pages.
USPTO Notice of Allowance for U.S. Appl. No. 10/001,478 dated Jun. 2, 2010;11 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2004; 8 pages.
USPTO Notice of Allowance for U.S. Appl. No. 12/060,128 dated Oct. 19, 2009; 8 pages.
USPTO Non-Final Rejection for U.S. Appl. No. 09/975,338 dated Apr. 30, 2010; 2 pages.
USPTO Advisory Action for U.S. Appl. No. 11/818,005 dated Jul. 30, 2010; 3 pages.
USPTO Non-Final Rejection for U.S. Appl. No. 12/132,527 dated Apr. 29, 2010; 7 pages.
USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Non-Final Rejection for U.S. Appl. No. 11/166,622 dated Jun. 22, 2010; 11 pages.
USPTO Final Rejection for U.S. Appl. No. 11/166,622 dated Mar. 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 30, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 21, 2010; 15 pages.
USPTO Non-Final Rejection for U.S. Appl. No. 121058,569 dated Aug. 2, 2010; 9 pages.
USPTO Final Rejection for U.S. Appl. No. 11/968,145 dated Aug. 2, 2010; 6 pages.
USPTO Non-Final Rejection for U.S. Appl. No. 11/968,145 dated Mar. 4, 2010; 11 pages.
USPTO Non-Final Rejection for U.S. Appl. No. 12/104.678 dated Jul. 2, 2010; 8 pages.
USPTO Advisory Action for U.S. Appl. No. 11/799,439 dated Mar. 30, 2009; 3 pages.
USPTO Notice of Allowance for U.S. Appl. No. 10/001,478 dated Sep. 7, 2010; 10 pages.
USPTO Final Rejection for U.S. Appl. No. 12/132,527 dated Oct. 14, 2010; 8 pages.
USPTO Non-Final Rejection for U.S. Appl. No. 11/201,627 dated Sep. 30, 2010; 6 pages.
USPTO Final Rejection for U.S. Appl. No. 11/698,660 dated Sep. 30, 2010; 19 pages.
USPTO Advisory Action for U.S. Appl. No. 11/698,660 dated Nov. 10, 2010; 3 pages.
USPTO Non-Final Rejection for U.S. Appl. No. 11/644,100 dated Sep. 15, 2010; 10 pages.
USPTO Non-Final Rejection for U.S. Appl. No. 11/201,922 dated Jun. 11, 2010; 12 pages.

USPTO Final Rejection for U.S. Appl. No. 12/060,176 dated Oct. 12, 2010; 22 pages.
USPTO Advisory Action for U.S. Appl. No. 12/136,557 dated Oct. 29, 2010; 3 pages.
USPTO Non-Final Rejection for U.S. Appl. No. 11/644,100 dated Dec. 16, 2009; 13 pages.
USPTO Final Rejection for U.S. Appl. No. 11/166,622 dated Mar. 18, 2010; 12 pages.
USPTO Advisory Action for U.S. Appl. No. 09/994,601 dated Mar. 23, 2010; 2 pages.
USPTO Non-Final Rejection for U.S. Appl. No. 11/818,005 dated Oct. 26, 2010; 10 pages.
USPTO Notice of Allowance for U.S. Appl. No. 09/998,848 dated Oct. 13, 2010; 4 pages.
USPTO Non-Final Rejection for U.S. Appl. No. 09/998,848 dated Jun. 21, 2010; 15 pages.
USPTO Advisory Action for U.S. Appl. No. 09/998,848 dated Feb. 24, 2010; 3 pages.
USPTO Non-Final Rejection for U.S. Appl. No. 09/989,767 dated Jul. 9, 2010; 22 pages.
USPTO Non-Final Rejection for U.S. Appl. No. 09/989,771 dated Jul. 20, 2010; 12 pages.
USPTO Advisory Action for U.S. Appl. No. 09/989,771 dated Feb. 3, 2010; 3 pages.
USPTO Miscellaneous Action for U.S. Appl. No. 10/113,581 dated Jun. 23, 2010; 6 pages.
USPTO Notice of Allowance for U.S. Appl. No. 10/113,581 dated Sep. 3, 2010; 11 pages.
USPTO Notice of Allowance for U.S. Appl. No. 12/057,149 dated Nov. 30, 2010; 7 pages.
USPTO Non-Final Rejection for U.S. Appl. No. 11/698,660 dated Dec. 13, 2010; 20 pages.
USPTO Notice of Allowance for U.S. Appl. No. 11/644,100 dated Jan. 6, 2011; 6 pages.
USPTO Non-Final Rejection for U.S. Appl. No. 11/201,922 dated Dec. 28, 2010; 14 pages.
USPTO Final Rejection for U.S. Appl. No. 11/166,622 dated Dec. 7, 2010; 12 pages.
USPTO Non-Final Rejection for U.S. Appl. No. 11/166,622 dated Jun. 22, 2010; 11 pages.
USPTO Final Rejection for U.S. Appl. No. 09/989,771 dated Jan. 4, 2011; 12 pages.
USPTO Non-Final Rejection for U.S. Appl. No. 09/975,338 dated Apr. 30, 2010; 10 pages.
USPTO Non-Final Rejection for U.S. Appl. No. 11/818,005 dated Oct. 26, 2010; 10 pages.
USPTO Non-Final Rejection for U.S. Appl. No. 11/968,145 dated Jan. 5, 2011; 8 pages.
USPTO Non-Final Rejection for U.S. Appl. No. 12/004,833 dated Dec. 21, 2010; 8 pages.
USPTO Notice of Allowance for U.S. Appl. No. 12/058,569 dated Dec. 13, 2010; 6 pages.
USPTO Non-Final Rejection for U.S. Appl. No. 09/989,782 dated Oct. 27, 2009; 9 pages.
USPTO Final Rejection for U.S. Appl. No. 12/104,678 dated Dec. 3, 2010; 9 pages.
USPTO Final Rejection for U.S. Appl. No. 11/857,947 dated Jan. 4, 2011; 14 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.
USPTO Non-Final Rejection for U.S. Appl. No. 12/058,534 dated Jan. 11, 2011; 17 pages.
USPTO Non-Final Rejection for U.S. Appl. No. 12/004,833 dated Dec. 21, 2010; 8 pages.
USPTO Requirement Restriction for U.S. Appl. No. 12/004,833 dated Sep. 22, 2010; 6 pages.
U.S. Appl. No. 12/058,856; "System and Method for Monitoring a Target Device, " Kenneth Ogami et al. filed on Mar. 28, 2008; 56 pages.

USPTO Notice of Allowance for U.S. Appl. No. 10/118,682 dated Apr. 3, 2006; 4 pages.
USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 3, 2004; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for U.S. Appl. No. 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
U.S. Appl. No. 10/002,726; "Method and Apparatus for Generting Microcontroller Configuration Information," Ogami et al., filed on Oct. 24, 2001; 54 pages.
USPTO Notice of Allowance for U.S. Appl. No. 10/002,726 dated feb. 6, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Dec. 13, 2004; 7 pages.
U.S. Appl. No. 111818,005: "Techniques for Generating Microcontroller Configuration Information," Ogami et al., filed on Jun. 12, 2007; 61 pages.
USPTO Requirement for Restriction/Election for U.S. Appl. No. 11/818,005 dated Jul. 14, 2009; 5 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
U.S. Appl. No. 09/475,879: "Programmable Logic Device," Lacey et al.; filed on Dec. 30, 1999; 50 pages.
U.S. Appl. No. 09/475,808: "Configurable Memory for Programmable Logic Circuits," Lacey et al.; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.

U.S. Appl. No. 10/137,497: "Reconfigurable Testing System and Method," Pleis et al.; filed on May 1, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
U.S. Appl. No. 10/172,670: "Method and System for Programming a Memory Device," Snyder et al.; filed on Jun. 13, 2002; 66 pages.
U.S. Appl. No. 11/986,338: Reconfigurable Testing System and Method, Pleis of al., filed on Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.
U.S. Appl. No. 11/965,291: "Universal Digital Block Interconnection and Channel Routing," Snyder et al., filed on Dec. 27, 2007; 31 pages.
USPTO Notice of Allowance for U.S. Appl. No. 11/986,338 dated May 7, 2009; 1 page.
USPTO Notice of Allowance for U.S. Appl. No. 09/475,879 dated Oct. 22, 2004; 7 pages.
Written Opinion of the International Search Authority for International Application No. PCT/US08/60680 dated Aug. 15, 2008; 4 pages.
U.S. Appl. No. 11/166,622: "Touch wake for electronic devices," Beard at al.; 22 pages.
International Written Opinion of the International Searching Authority for International Application No. PCT/US2006/09572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
U.S. Appl. No. 10/024,093: "Configurable Memory for Programmable Logic Circuits," Lacey at al.; 25 pages.
U.S. Appl. No. 11/088,028: "Method and Circuit for Rapid Alignment of Signals," Moyal et al., filed on Nov. 13, 2007; 34 pages.
USPTO Notice of Allowance for U.S. Appl. No. 11/088,028 dated Jul. 2, 2007; 6 pages.
USPTO Notice of Allowance for U.S. Appl. No. 11/088,028 dated Jan. 26, 2007; 6 pages.
USPTO Non-Final Rejection for U.S. Appl. No. 11/088,028 dated Jun. 16, 2006; 8 pages.
U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.

* cited by examiner

INPUT/OUTPUT MULTIPLEXER BUS

CROSS REFERENCE TO RELATED APPLICATION

This application claims the benefit of U.S. Provisional Application No. 60/786,124, filed on Mar. 27, 2006, the contents of which are incorporated herein by reference.

TECHNICAL FIELD

This disclosure relates generally to bus architecture, and in particular but not exclusively, relates to an input/output bus capable of multiplexing input/output ports for various capacitance sense techniques.

BACKGROUND INFORMATION

Capacitance sensors are used to implement a variety of useful functions including touch sensors (e.g., touch pad, touch dial, touch wheel, etc.), determining the presence of an object, accelerometers, and other functions. FIG. 1A illustrates a conventional capacitance sensor 100 including a relaxation oscillator, a reference clock, and a frequency comparator. The relaxation oscillator is coupled to drive a charging current ($I_C$) in a single direction onto a device under test ("DUT") capacitor. As the charging current accumulates charge on the DUT capacitor, the voltage across the capacitor increases with time as a function of $I_C$ and its capacitance C. Equation 1 describes the relation between current, capacitance, voltage and time for a charging capacitor.

$$CdV = I_c dt \quad \text{(Equation 1)}$$

The relaxation oscillator begins by charging the DUT capacitor from a ground potential or zero voltage and continues to accumulate charge on the DUT capacitor at a fixed charging current Ic until the voltage across the DUT capacitor reaches a reference voltage (Vref). At Vref, the relaxation oscillator allows the accumulated charge to discharge or the DUT capacitor to "relax" back to the ground potential and then the process repeats itself. The relaxation oscillator outputs a relaxation oscillator clock signal (RO CLK) having a frequency ($f_{RO}$) dependent upon capacitance C of the DUT capacitor, charging current $I_C$, a discharge time $t_d$, and Vref, as described in equation 2 below.

$$f_{RO} = \left( C \cdot \frac{Vref}{I_C} + t_d \right)^{-1} \quad \text{(Equation 2)}$$

If capacitance C of the DUT capacitor changes, then $f_{RO}$ will change proportionally according to equation 2. By comparing $f_{RO}$ of RO CLK against the frequency ($f_{REF}$) of a known reference clock signal (REF CLK), the change in capacitance ΔC can be measured. Accordingly, equations 3 and 4 below describe that a change in frequency between RO CLK and REF CLK is proportional to a change in capacitance of the DUT capacitor.

$$\Delta C \propto \Delta f, \text{ where} \quad \text{(Equation 3)}$$

$$\Delta f = f_{RO} - f_{REF} \quad \text{(Equation 4)}$$

The frequency comparator is coupled to receive RO CLK and REF CLK, compare their frequencies $f_{RO}$ and $f_{REF}$, respectively, and output a signal indicative of the difference Δf between these frequencies. By monitoring Δf one can determine whether the capacitance of the DUT capacitor has changed.

FIG. 1B illustrates another capacitance sensing technique using a charge transfer mechanism. FIG. 1B illustrates a conventional capacitance sensor 101 including three switches 105 with control terminals φ0, φ1, and φ2, and summing capacitor 110 having a capacitance $C_{SUM}$, and an analog to digital ("ADC") converter 115. Capacitance sensor 101 may be used to sense changes in a DUT capacitor 120 having a changing capacitance $C_{DUT}$.

During operation, capacitance sensor 101 operates as follows to sense capacitance changes on DUT capacitor 120. First, summing capacitor 110 is discharged to a ground potential by asserting control terminal φ0 to open circuit switch SW0 and by asserting control terminal φ1 to close circuit switch SW1. Once discharged to ground, integrating capacitor 110 is disconnected from ground by asserting φ1 to open switch SW1. Then, DUT capacitor 120 is charged to the supply voltage VS by asserting φ0 to open circuit switch SW0 and asserting φ2 to close circuit switch SW2. Once DUT capacitor 120 charges to the supply voltage VS, the charge on DUT capacitor 120 is transferred onto summing capacitor 110 and distributed between the two capacitors. Charge transfer occurs by asserting φ1 and φ2 to open circuit switches SW1 and SW2, respectively, and asserting φ0 to close circuit switch SW0.

The above stages of charging DUT capacitor 120 and transferring the charge onto summing capacitor 110 are repeated a fixed number times causing the voltages of nodes N1 and N2 to ramp with time as illustrated in line graphs 130 and 135, respectively. After a fixed number of consecutive charging stages and charge transferring stages, ADC converter 115 samples the final voltage on node N2. The capacitance $C_{DUT}$ is determined based on the output of ADC converter 115 and is proportional to the voltage at node N2 after the final charge transfer stage.

Conventional integrated circuits incorporating a capacitance sense function typically include only one of the above types of capacitance sensors. These conventional capacitance sensors are hardwired directly to a single input/output port and cannot be flexibly coupled to a selectable port by the user.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of operation for an input/output multiplexer bus are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
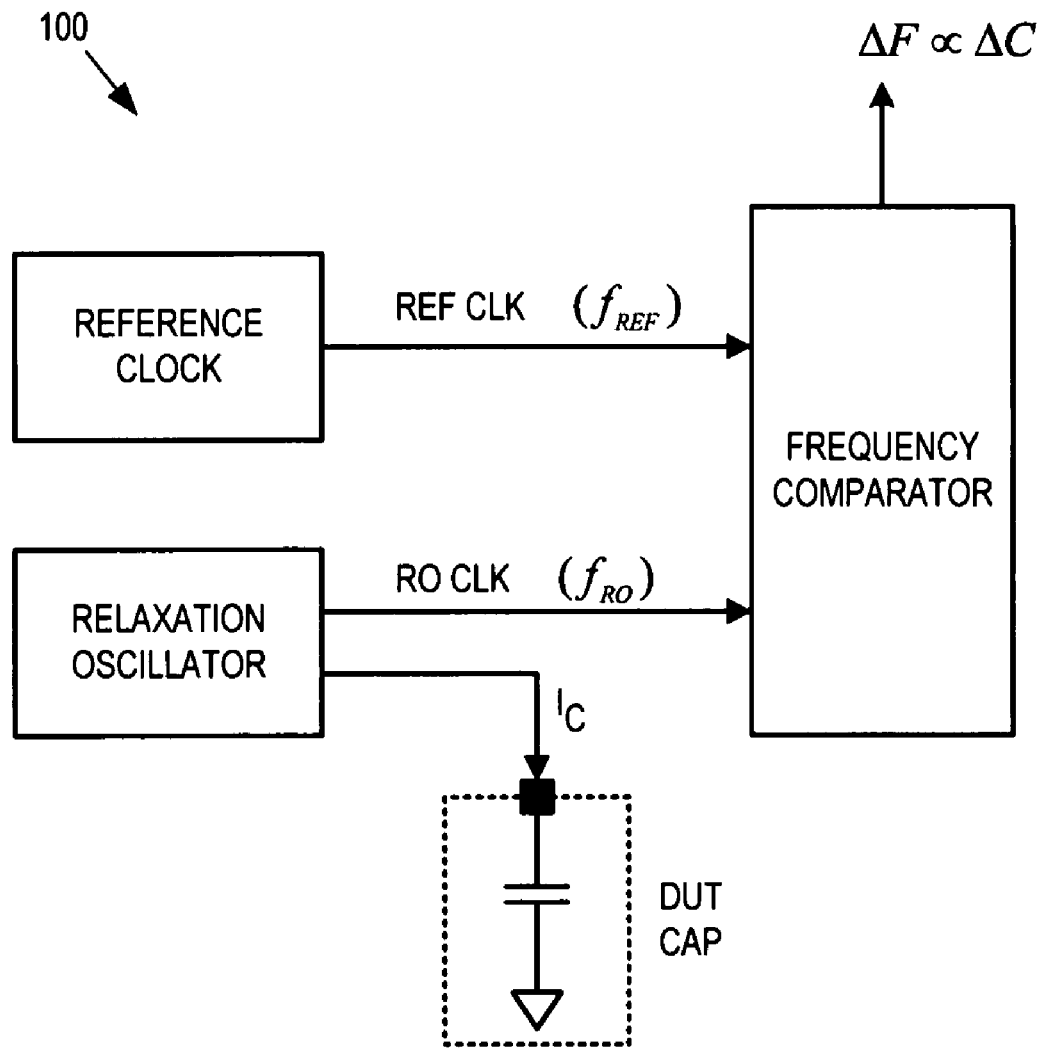
FIG. 1A is a block diagram illustrating a conventional capacitance sensor.
Figure 1B:
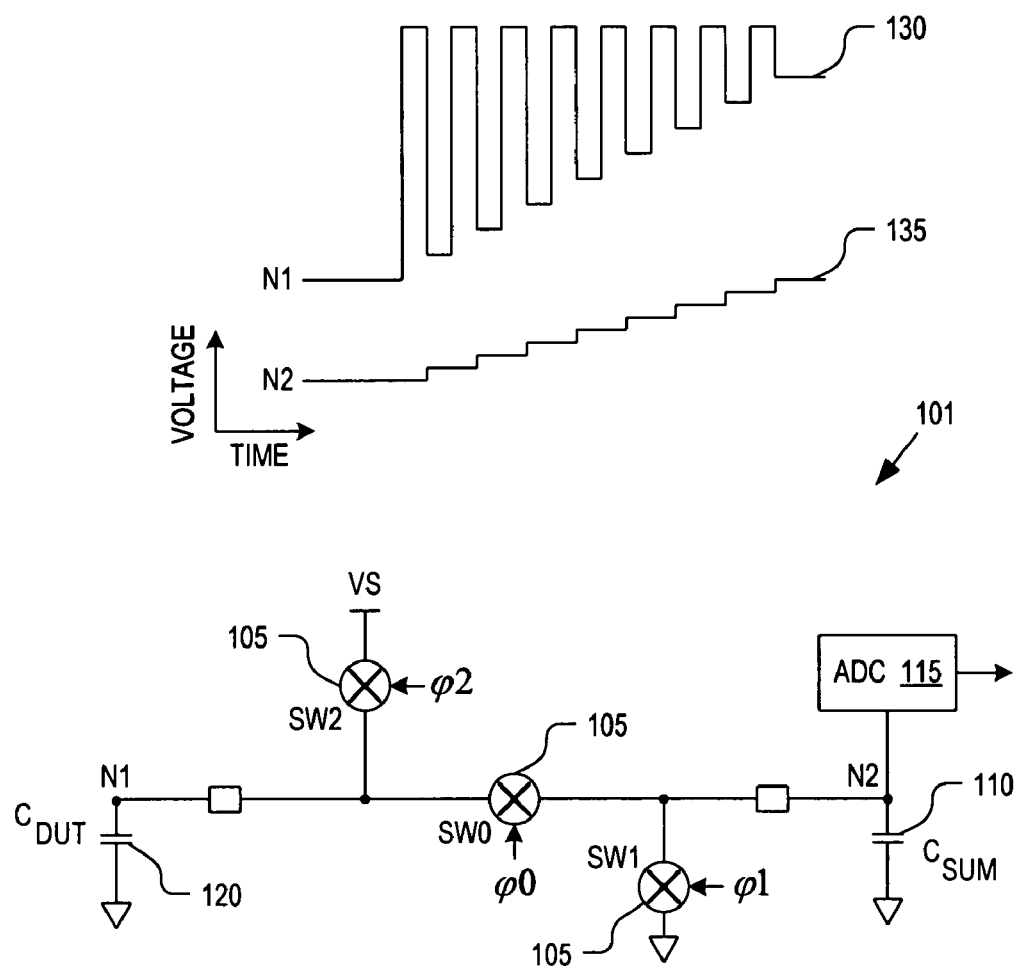
FIG. 1B is a block diagram illustrating a conventional capacitance sensor.
Figure 2:
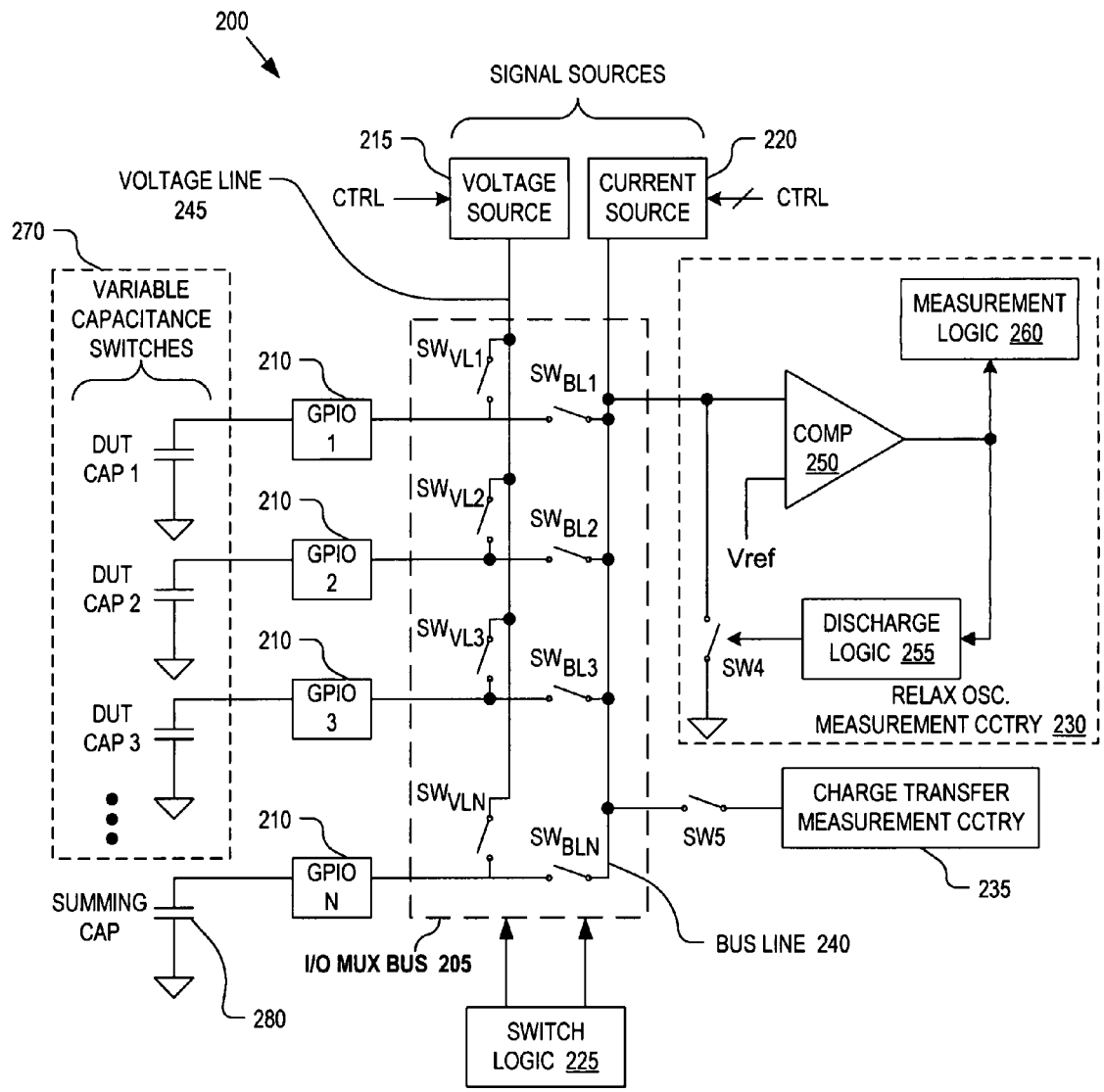
FIG. 2 is functional block diagram illustrating an input/output ("I/O") multiplexer bus and capacitance sensing circuitry coupled thereto, in accordance with an embodiment of the invention.

FIG. 2 is functional block diagram illustrating an input/output ("I/O") system 200, in accordance with an embodiment of the invention. The illustrated embodiment of I/O system 200 includes an I/O multiplexer ("MUX") bus 205, general purpose I/O ("GPIO") ports 210, a voltage source 215, a current source 220, switch logic 225, relaxation oscillator circuitry 230, and charge transfer measurement circuitry 235.

Relaxation oscillator circuitry 230 and charge transfer measurement circuitry 235 represent two examples of capacitance measuring circuits that may be coupled to I/O MUX bus 205. The capacitance measuring circuits can be time multiplexed or time shared by I/O MUX bus 205 to selectively measure/monitor the capacitance of external device under test ("DUT") capacitors (e.g., DUT CAP 1, DUT CAP 2, DUT CAP 3) coupled via GPIOs 210. Although the illustrated embodiment of I/O system 200 includes only relaxation oscillator measurement circuitry 230 and charge transfer measurement circuitry 235, it should be appreciated that any number and other types of circuitry may be coupled internally to I/O multiplexer bus 205 for time multiplexing across GPIO ports 210. For example, other types of capacitance measuring/monitoring circuitry may be coupled internally to I/O MUX bus 205, such as a successive approximate capacitance measuring circuit, or otherwise. Other non-capacitance sense related circuitry may also be multiplexed onto GPIO ports 210 via I/O MUX bus 205. In one embodiment, GPIO ports 210 are analog I/O ports of a semiconductor device. GPIO ports 210 may include electrostatic discharge ("ESD") protection circuitry for protecting the internal structure of the semiconductor device (e.g., relaxation oscillator measurement circuitry 230 or charge transfer measurement circuitry, etc.).

The illustrated embodiment of I/O MUX bus 205 includes a bus line 240, a voltage line 245, bus line switches (e.g., SW_BL1, SW_BL2, SW_BL3 . . . SW_BLN) and voltage line switches (e.g., SW_VL1, SW_VL2, SW_VL3 . . . SW_VLN). Current source 220 is coupled to bus line 240 while voltage source 215 is coupled to voltage line 245. In one embodiment, one or both of current source 220 and voltage source 215 are variable sources capable of driving selectable currents or voltages onto bus line 240 or voltage line 245, respectively. For example, current source 220 may be a processor controlled current digital-to-analog converter ("DAC"). Similarly, voltage source 215 may be a processor controlled voltage DAC, or other selectable voltage divider circuit. Collectively, voltage source 215 and current source 220 may be referred to as "signal sources" herein.

In one embodiment, bus line 240 is capable of propagating analog or digital signals in or out of GPIO ports 210. Similarly, voltage line 245 may be capable of propagating analog or digital signals through GPIO ports 210. The bus line switches and voltage line switches are programmable and controlled by switch logic 225. In one embodiment, each bus line switch and voltage line switch can be independently controlled and switched by switch logic 225. Accordingly, the bus line switches can be configured to divert current form current source 220 through any one or more of GPIO ports 210 and the voltage line switches can be configured to couple any of GPIO ports 210 to voltage source 215.

The illustrated embodiment of relaxation oscillator measurement circuitry 230 includes a comparator 250, discharge logic 255, a discharge switch SW4, and measurement logic 260. Relaxation oscillator measurement circuitry 230 may be used to implement various types of relaxation oscillator capacitance sensing techniques. During operation, switching logic 225 configures the bus line switches to divert current from current source 220 into one of GPIO ports 210. When the externally coupled DUT capacitor charges to a voltage Vref, the output of comparator 250 toggles, causing discharge logic 255 to close discharge switch SW4. The closed discharge switch SW4 discharges bus line 240 and the externally coupled DUT capacitor. The externally attached DUT capacitor may be reciprocally charged and discharged by current source 220 and discharge switch SW4 for a fixed number of cycles or a period of time. During this charge and discharging phase, measurement logic 260 can analyze the output of comparator 250 to measure or monitor for capacitance changes in the selected DUT capacitor. Measurement logic 260 may use a variety of techniques to monitor for capacitance changes by directly or indirectly monitoring for period changes, frequency changes, or duty cycle of the output of comparator 250. In one embodiment, the output from comparator 250 is used to gate a clock signal to form a counter. The number of gated clock cycles counted by the counter is then related to the capacitance on the selected DUT capacitor. Once relaxation oscillator measurement circuitry 230 has measured the capacitance of a selected externally coupled DUT capacitor, then switching logic 225 can reprogram I/O MUX bus 205 to sequentially coupled each DUT capacitor to relaxation oscillator measurement circuitry 230, in turn, for capacitance measuring. Switch logic 225 may follow a fixed sequence that is repeated to time share the capacitance measurement circuitry across all or a portion of GPIO ports 210, or follow a random sequence. The operation of relaxation oscillator measurement circuitry 230 is described in detail below in connection with FIG. 4.

The illustrated embodiment of I/O system 200 further includes charge transfer measurement circuitry 235 for measuring and monitoring the capacitance of the externally coupled DUT capacitors. Charge transfer measurement circuitry 235 may be selectively coupled to bus line 240 via switch SW5 under control of switch logic 225 to measure the capacitance of any one of the externally coupled DUT capacitors. In one embodiment, charge transfer measurement circuitry 235 may include an analog-to-digital converter ("ADC") for measuring an accumulated voltage on a summing capacitor 280 coupled to GPIO port (N) and outputting a digital value indicative of the analog voltage value. Operation of charge transfer measurement circuitry 235 is described in detail below in connection with FIG. 5. Although relaxation oscillator measurement circuitry 230 and charge transfer measurement circuitry 235 are illustrated as distinct circuits, in some embodiments they may share internal components.

It should be appreciated that I/O MUX bus 205 may be used to implement a flexible I/O subsystem for multiplexing a plurality of miscellaneous internal circuits across a plurality of I/O ports. However, I/O MUX bus 205 is well suited for coupling a capacitance sense user interface to an integrated circuit control system. In this operating scenario, the DUT capacitors may represent variable capacitance switches of a capacitance sense interface 270. The capacitance sense interface 270 may be a simple multi-button interface where each variable capacitance switch corresponds to an individual capacitance sense button, a linear or radial slider where each variable capacitance switch represents an individual resolution element of the linear or radial slider.

Figure 3:
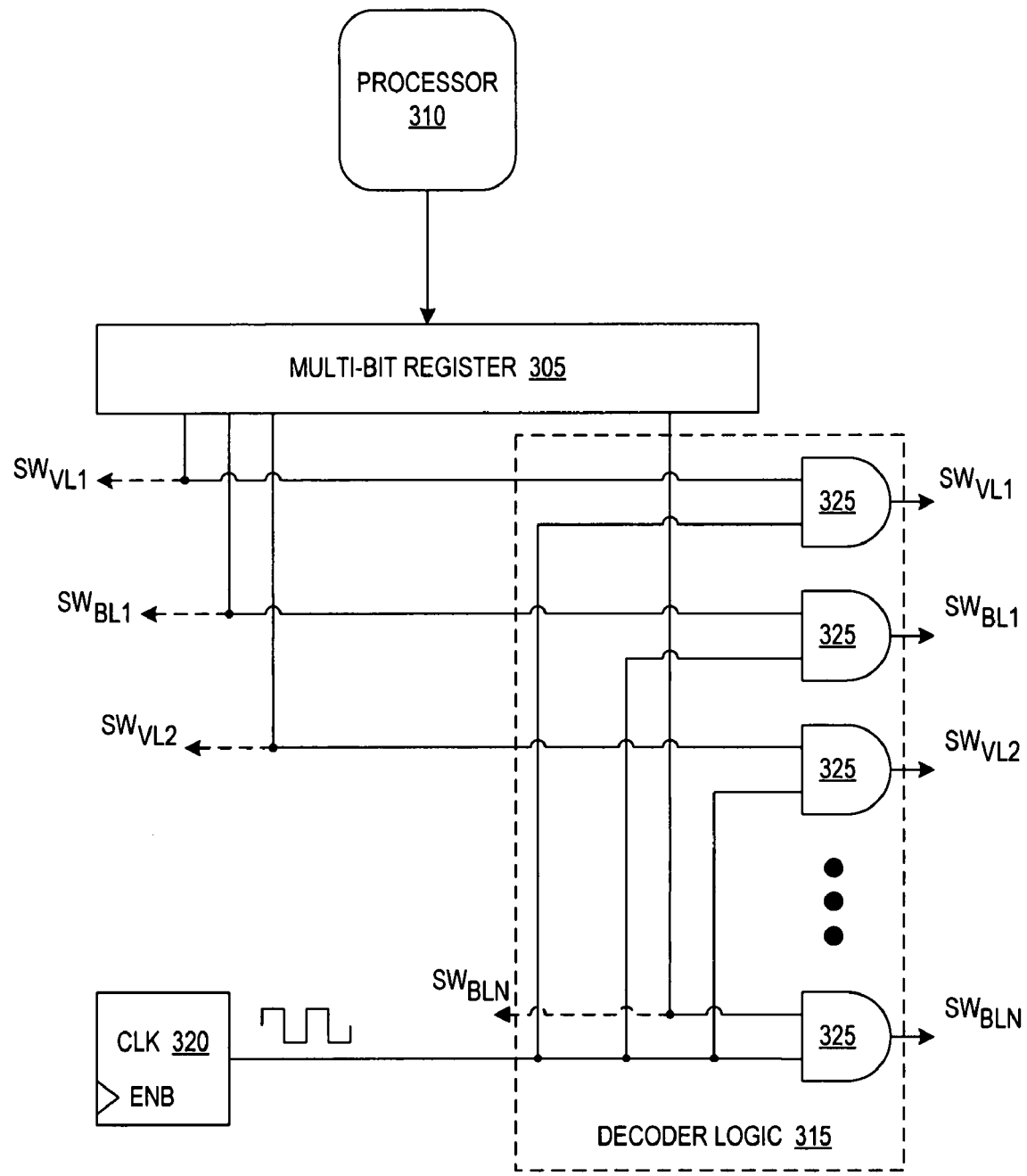
FIG. 3 is a functional block diagram illustrating switch logic for controlling switches within an I/O multiplexer bus, in accordance with an embodiment of the invention.

FIG. 3 is a functional block diagram illustrating switch logic 300 for controlling switches within I/O MUX bus 205, in accordance with an embodiment of the invention. Switch logic 300 represents one possible embodiment of switch logic 225 in FIG. 2. The illustrated embodiment of switch logic 300 includes a multi-bit register 305, a processor 310, decoder logic 315, and a clock source 320. The illustrated embodiment of decoder logic 315 includes logic gates 325.

During operation, processor 310 programs multi-bit register 305 with a multi-bit value, which is then decoded to control the bus line switches, the voltage line switches, and switch SW5. In one embodiment, each switch controlled by switch logic 300 corresponds to a single bit location within multi-bit register 305. Control terminals of the switches may be directly coupled to individual bit positions within multi-bit register 305 (illustrated by the dash arrows), or may be indirectly coupled via decoder logic 315.

In an embodiment where the control terminals of the switches are directly coupled, if the bit position corresponding to a particular switch is programmed to '0', the switch is closed, if the bit position is programmed to '1', the switch is opened (or visa versa). Decoder logic 315 may be interposed between the control terminals of the switches and multi-bit register 305 to provide automated frequency switching of selected switches. For example, during operation it may be desirable to scan through each GPIO port 210 and reciprocally charge and discharge each variable capacitance switch for a period of time or set number cycles, before moving to the next GPIO port 210 in a scan sequence. Clock source 320 may be used to set the reciprocal charge and discharge frequency while multi-bit register 305 can be programmed under control of processor 310 to determine the scan sequence.

Figure 4:
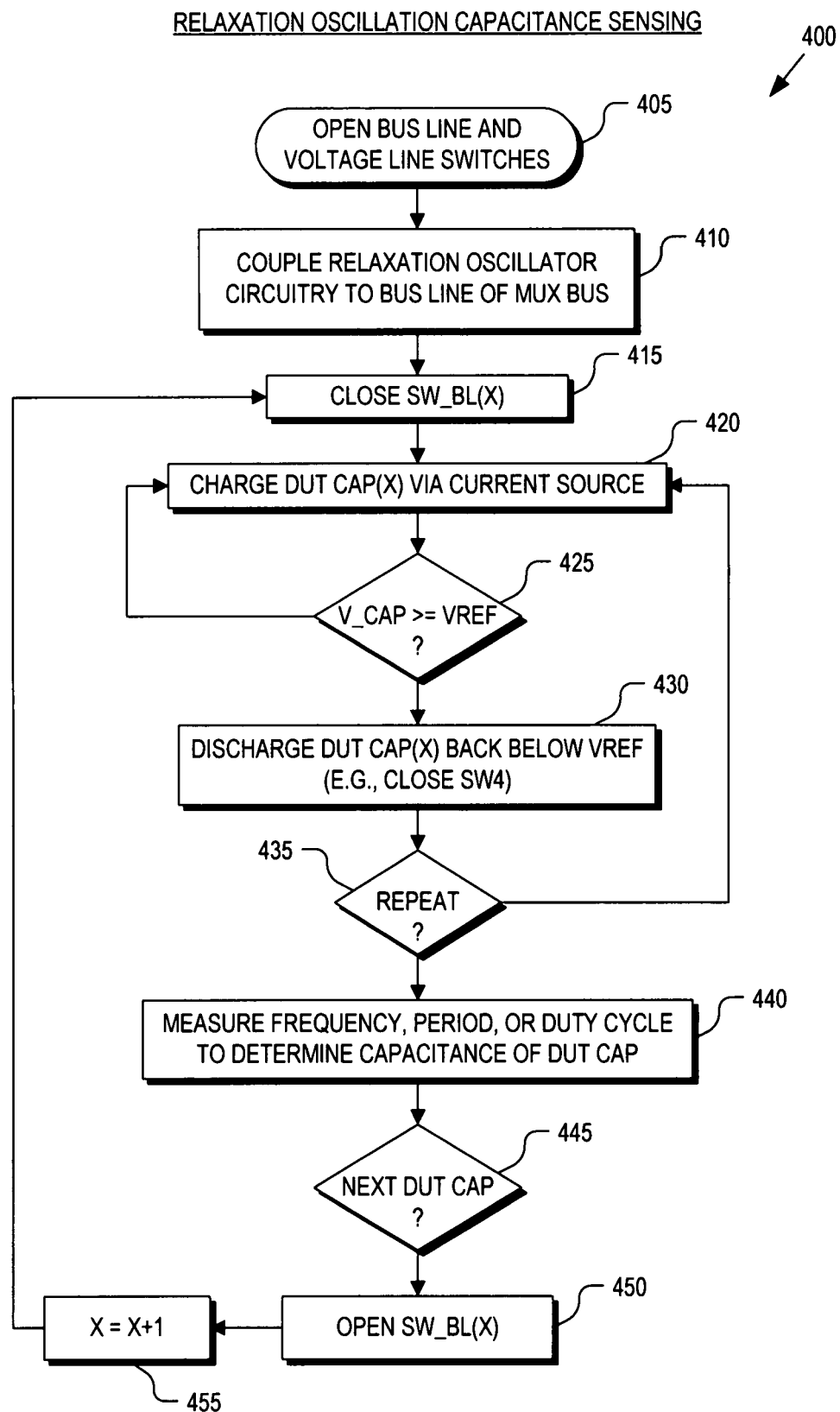
FIG. 4 is a flow chart illustrating a process for operating an I/O multiplexer bus to implement a relaxation oscillator capacitance sensing technique, in accordance with an embodiment of the invention.

FIG. 4 is a flow chart illustrating a process 400 for operating I/O MUX bus 205 to implement a relaxation oscillator capacitance sensing technique, in accordance with an embodiment of the invention. Process 400 may be implemented to monitor the variable capacitance switches of capacitance sense interface 270 using relaxation oscillator measurement circuitry 230. The order in which some or all of the process blocks appear in process 400 below should not be deemed limiting. Rather, one of ordinary skill in the art having the benefit of the present disclosure will understand that some of the process blocks may be executed in a variety of orders or even in parallel.

In a process block 405, the bus line and voltage line switches are open circuited under control of switch logic 225. In a process block 410, relaxation oscillator measurement circuitry 230 is coupled to bus line 240. In one embodiment, coupling relaxation oscillator measurement circuitry 230 may include closing a switch coupled between relaxation oscillator measurement circuitry 230 (not illustrated) or simply enabling comparator 250.

Once relaxation oscillator measurement circuitry 230 is coupled and enabled, a selected one of the bus line switches (e.g., SW_BL(X), wherein X=1) is closed (process block 415) to couple DUT CAP(X) to bus line 240. Once closed, current source 220 commences charging DUT CAP(X) through SW_BL(X) (process block 420) until the voltage V_CAP on DUT CAP(X) reaches Vref (decision block 425). Once V_CAP reaches Vref, the output of comparator 250 toggles causing discharged logic 255 to close circuit switch SW4, thereby discharging bus line 240 and DUT CAP(X) through switch SW4 back below Vref (process block 430). Once the voltage on DUT CAP(X) falls below Vref, comparator 250 toggles its output once again and discharge logic 255 open circuits switch SW4. In one embodiment, discharge logic 255 may include a latch or other time delay circuit to introduce a small feedback delay for controlling discharged switch SW4. Process 400 loops back to process block 420 reciprocally charging (process block 420) and discharging (process block 430) DUT CAP(X) until a fixed number of cycles has been reached or a period of time has expired (decision block 435).

In a process block 440, measurement logic 260 determines the capacitance or capacitance change of DUT CAP(X) based on the output of comparator 250. Measurement logic 260 may monitor for frequency changes, period changes, or changes in the duty cycle of the output from comparator 250 to determine whether the capacitance of DUT CAP(X) has significantly changed, thereby indicating a user instigated button press or other user interaction with capacitance sense interface 270.

In a decision block 445, switch logic 225 determines that it is time to reconfigure I/O MUX bus 205 to couple relaxation oscillator circuitry 230 to the next GPIO port 210 in the sequence. This determination may be based upon a number of toggle cycles of comparator 250, a number of clock cycles of a system clock, upon expiration of a fixed period of time, randomly, or otherwise. Finally, SW_BL(X) is open circuited (process block 450), the next GPIO port 210 in the sequence determined (process block 455) and process 400 repeats itself from process block 415. Process block 455 illustrates a simply incremental sequence whether GPIO ports 210 are scanned in an incrementing order; however, it should be appreciated that more complex sequences may be implemented by switch logic 225, including random sequences using a pseudo-random sequence generator.

Figure 5:
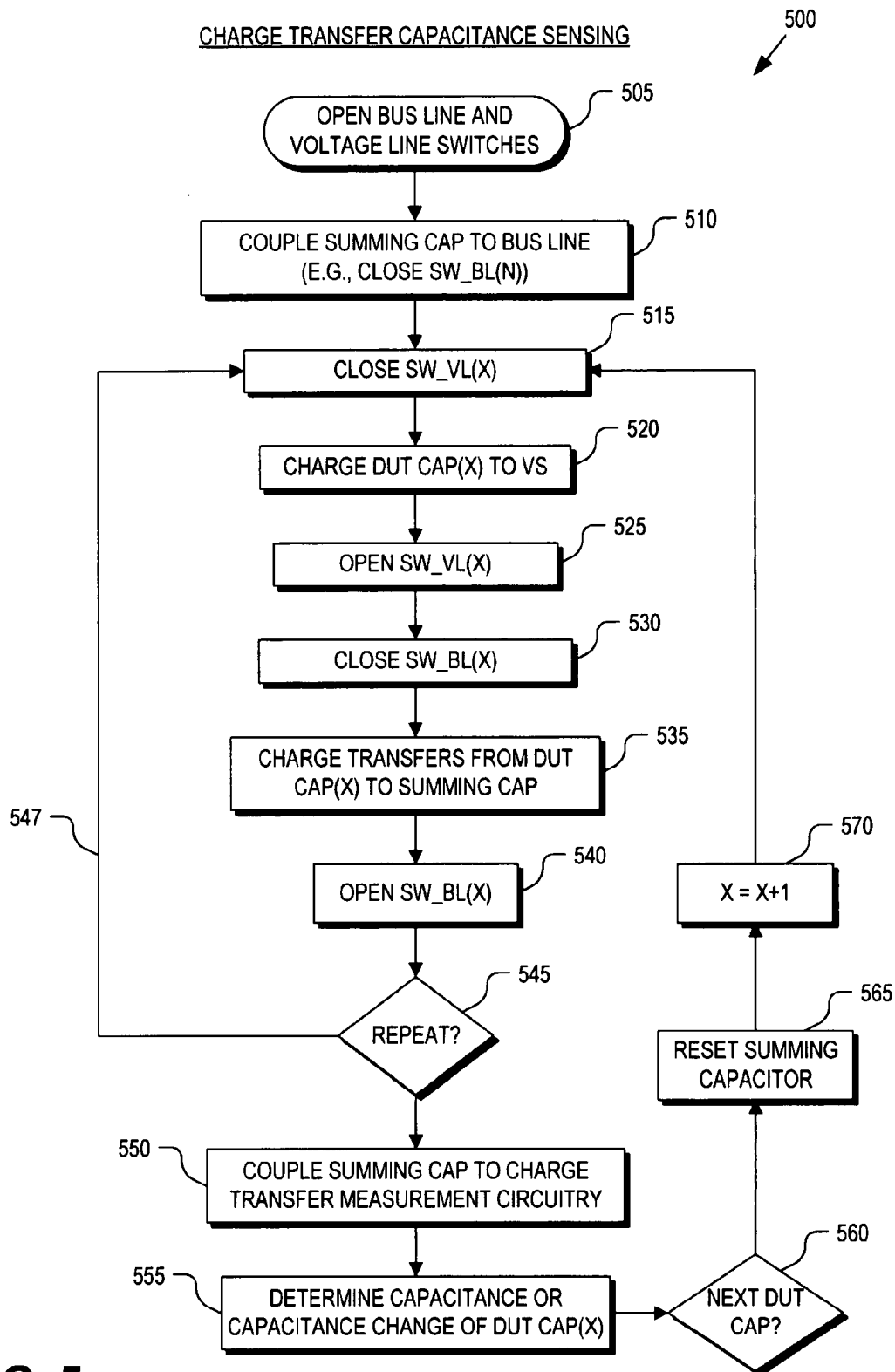
FIG. 5 is a flow chart illustrating a process for operating an I/O multiplexer bus to implement a charge transfer capacitance sensing technique, in accordance with an embodiment of the invention.

FIG. 5 is a flow chart illustrating a process 500 for operating I/O MUX bus 205 to implement a charge transfer capacitance sensing technique, in accordance with an embodiment of the invention. Process 500 may be implemented to monitor the variable capacitance switches of capacitance sense interface 270 using charge transfer measurement circuitry 235. The order in which some or all of the process blocks appear in process 500 below should not be deemed limiting. Rather, one of ordinary skill in the art having the benefit of the present disclosure will understand that some of the process blocks may be executed in a variety of orders or even in parallel.

In a process block 505, the bus line and voltage line switches are open circuited under control of switch logic 225. In a process block 510, summing capacitor 280 is coupled to bus line 240 by closing the associated bus line switch SW_BLN. In one embodiment, summing capacitor 280 is an externally coupled capacitor having a capacitance significantly larger than any of the DUT capacitors of capacitance sense interface 270.

In a process block 515, SW_VL(X) (e.g., X=1 for the first scan through capacitance sense interface 270) is closed under control of switch logic 225, coupling DUT CAP(X) to voltage source 215 and charging DUT CAP(X) to a supply voltage VS (process block 520). In a process block 525, SW_VL(X) is open circuited to decoupled voltage source 215 from DUT CAP(X). Once voltage line 245 has been decoupled from GPIO port (X) 210, then SW_BL(X) is closed circuited (process block 530) to transfer the charge accumulated on DUT CAP(X) onto summing capacitor 280 via bus line 240 (process block 535). Once the charge is transferred, SW_BL(X) is once again open circuited (process block 540), and process 500 loops back to process block 515 to execute another set of charge and charge transfer cycles (note, the charge transfer phase may also be referred to as a discharge phase). In one embodiment, the switch logic 225 continues to loop back along path 547 for a fixed number of cycles (decision block 545), reciprocally charging DUT CAP(X) via voltage source 215 and discharging DUT CAP(X) into summing capacitor 280.

After the charging and discharging cycles are complete, summing capacitor 280 is coupled to charge transfer measurement circuitry 235 via closing SW5 (process block 550). In process block 555, charge transfer measurement circuitry 235 analyzes the accumulated charge or voltage on summing capacitor 280 to determine the capacitance or capacitance change of DUT CAP(X). In one embodiment, charge transfer measurement circuitry 235 includes an ADC that measures the final voltage on summing capacitor 280.

Once the capacitance or capacitance change on DUT CAP(X) is determined, switch logic 225 reconfigures I/O MUX bus 205 to test/analyze the next variable capacitance switch within capacitance sense interface 270 (decision block 560). Prior to analyzing the next DUT capacitor, summing capacitor 280 is reset (e.g., discharged) (process block 565). In a process block 570, the next DUT capacitor in the scan sequence is determined. In the illustrated embodiment, the scan sequence is a simply scans through GPIO ports 210 in order; however, any scan sequence can be implemented including a random or irregular sequence.

Figure 6:
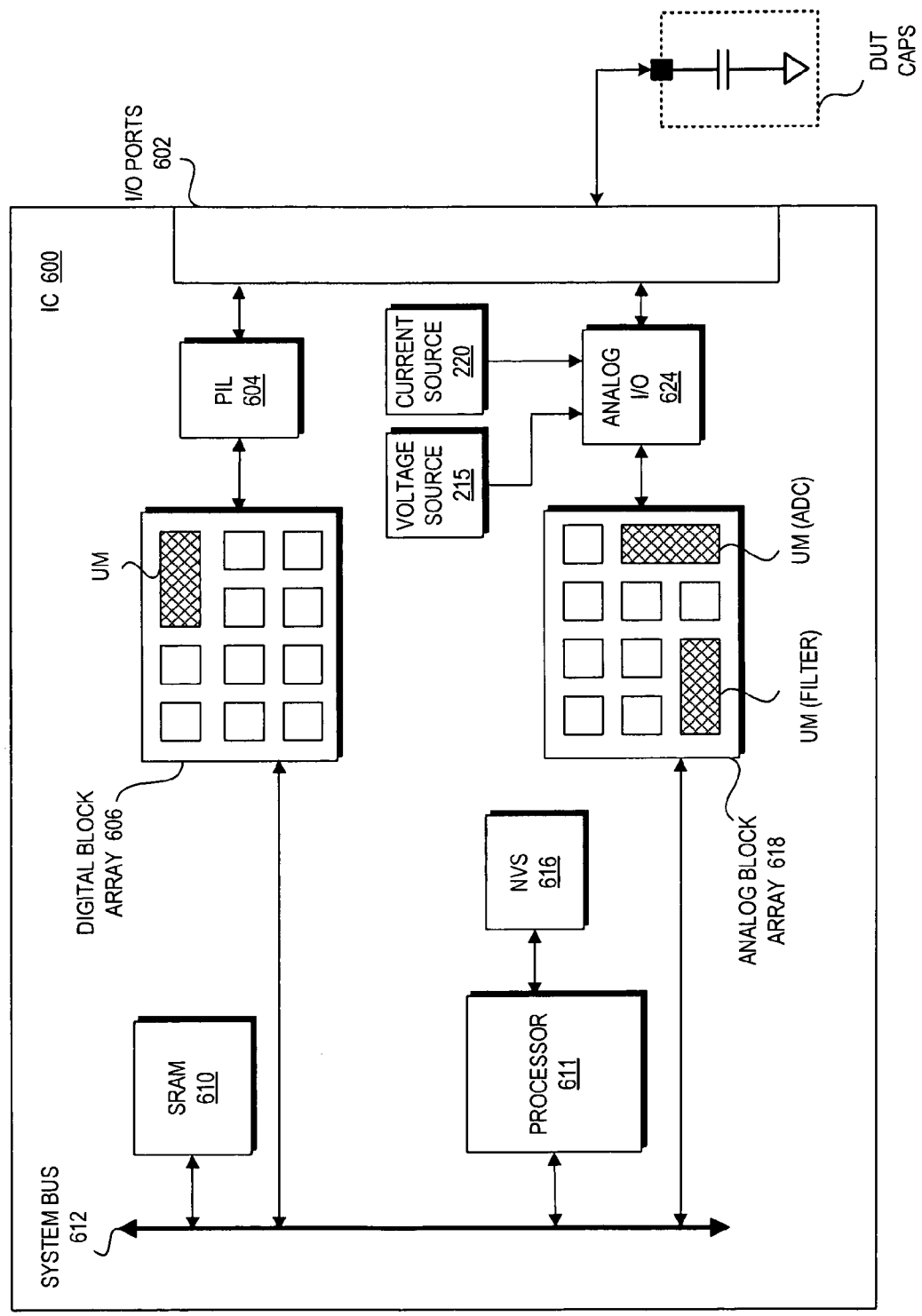
FIG. 6 illustrates a demonstrative integrated circuit for implementing an embodiment of the invention.

FIG. 6 illustrates a demonstrative integrated circuit ("IC") 600 implemented using an embodiment of I/O system 200. IC 600 illustrates a Programmable System on a Chip (PSoC™) microcontroller by Cypress Semiconductor Corporation. The illustrated embodiment of IC 600 includes programmable input/output ("I/O") ports 602, at least a portion of which correspond to GPIO ports 210. I/O ports 602 are coupled to Programmable Interconnect and Logic ("PIL") 604 which acts as an interconnect between I/O ports 602 and a digital block array 606. Digital block array 606 may be configured to implement a variety of digital logic circuits (e.g., DAC, digital filters, digital control systems, etc.) using configurable user modules ("UMs"). Digital block array 606 is further coupled to a system bus 612.

Static Random Access Memory ("SRAM") 610 and processor 611 are also coupled to system bus 612. Processor 611 is coupled to non-volatile storage ("NVS") 616 which may be used to store firmware (e.g., control algorithms executable by processor 611 to implement process 400 or 500). In one embodiment, processor 611 corresponds to processor 310 and implements a portion of switch logic 300 to program multi-bit register 305

An analog block array 618 is coupled to system bus 612. Analog block array 618 also may be configured to implement a variety of analog circuits (e.g., ADC, analog filters, comparators, current sources, etc.) using configurable UMs. Analog block array 618 is also coupled to an analog I/O unit 624 which is coupled to I/O ports 602. In one embodiment, I/O MUX bus 205 is included within analog I/O 624.

As illustrated, voltage source 215 and current source 220 may be incorporated into IC 600 and coupled to analog I/O unit 624. Various subcomponents of relaxation oscillator measurement circuitry 230 and charge transfer measurement circuitry 235 may be implemented with various UMs of digital clock array 606 and/or analog block array 618 or the subcomponents may be stand alone components.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

I/O system 200 may be incorporated into IC 600, as well as, various other integrated circuits. Descriptions of I/O system 200 may be generated and compiled for incorporation into other integrated circuits. For example, behavioral level code describing I/O system 200, or portions thereof, may be generated using a hardware descriptive language, such as VHDL or Verilog, and stored to a machine-readable storage medium. Furthermore, the behavioral level code can be compiled into register transfer level ("RTL") code, a netlist, or even a circuit layout and stored to a machine-readable storage medium. The behavioral level code, the RTL code, the netlist, and the circuit layout all represent various levels of abstraction to describe I/O system 200.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
   a plurality of input/output ("I/O") ports;
   measurement circuitry to measure one or more electrical properties of one or more devices to be externally coupled to one or more of the I/O ports; and
   a I/O multiplexer bus coupled between the I/O ports and the measurement circuitry, the I/O multiplexer bus programmable to selectively couple the measurement circuitry to any of the I/O ports, wherein the I/O multiplexer bus includes;
   a bus line coupled to the measurement circuitry;
   a plurality of bus line switches, each coupled between one of the I/O ports and the bus line; and
   switching logic coupled to the bus line switches to control the bus line switches; and a current source coupled to the bus line to drive a current through the bus line, wherein the switching logic is coupled to selectively drive the current through one or more of the I/O ports.

2. The apparatus of claim 1, wherein the measurement circuit comprises capacitance sensing circuitry to measure a variable capacitance of the one or more devices to be externally coupled to the one or more of the I/O ports.

3. The apparatus of claim 2, wherein the capacitance sensing circuitry comprises:
a comparator having a first input coupled to the bus line and a second input coupled to receive a reference voltage;
measurement logic coupled to receive an output from the comparator, the measurement logic to measure at least one of a duty cycle, a frequency, or a period of the output from the comparator;
a discharge switch coupled to selectively discharge the bus line; and
discharge logic coupled to receive the output from the comparator and to control the discharge switch in response to the output from the comparator.

4. The apparatus of claim 1, further comprising a voltage source, and wherein the I/O multiplexer bus further comprises:
a voltage line coupled to the voltage source; and
a plurality of voltage line switches, each coupled between the voltage line and one of the I/O ports, wherein the switching logic is further coupled to selectively couple the voltage source to any of the I/O ports via control of the voltage line switches.

5. The apparatus of claim 1, wherein the switching logic comprises:
a multi-bit register to store a multi-bit value, wherein the bus line switches are controlled responsive to the multi-bit value; and
a processor coupled to the multi-bit register to program the multi-bit register with the multi-bit value.

6. The apparatus of claim 5, wherein the switching logic further comprises:
a clock source to generate a clock signal; and
decoder logic coupled to the multi-bit register, the clock source, and the bus line switches, the decoder logic coupled to switch a selected one or more of the bus line switches based on the multi-bit value at a frequency based on the clock signal.

7. The apparatus of claim 6, further comprising a plurality of capacitance sense buttons of a capacitance sense interface, each of the capacitance sense buttons coupled externally to one of the I/O ports, wherein the decoder logic is coupled to time share the measurement circuitry on the I/O multiplexer bus to sequentially monitor a capacitance of each of the capacitance sense buttons.

8. An apparatus, comprising:
a plurality of input/output ("I/O") means for conveying analog signals into and out of an integrated circuit;
measurement means for measuring one or more electrical properties of one or more devices to be externally coupled to one or more of the I/O means; and
means for time-sharing the measurement means across the plurality of I/O means, wherein the means for time-sharing is programmable to selectively individually couple the measurement means to any of the I/O means, wherein the means for time-sharing includes:
a voltage line coupled to a means for generating a voltage;
a plurality of voltage line switches, each coupled between the voltage line and one of the I/O means; and
a means for controlling the voltage line switches to selectively couple the means for generating the voltage to any of the I/O means.

9. The apparatus of claim 8, wherein the means for time-sharing further comprises:
a bus line coupled to the measurement means; and
a plurality of bus line switches, each coupled between one of the I/O means and the bus line, wherein the means for controlling includes a means for controlling the bus line switches.

10. The apparatus of claim 9, further comprising a means for generating a current coupled to the bus line to drive the current through the bus line and wherein the measurement means comprises:
a comparator having a first input coupled to the bus line and a second input coupled to receive a reference voltage;
measurement logic coupled to receive an output from the comparator, the measurement logic to measure at least one of a duty cycle, a frequency, or a period of the output from the comparator;
a discharge switch coupled to selectively discharge the bus line; and
discharge logic coupled to receive the output from the comparator and to control the discharge switch in response to the output from the comparator.

11. The apparatus of claim 9, wherein the means for controlling comprises:
a multi-bit register to store a multi-bit value, wherein the bus line switches are controlled responsive to the multi-bit value; and
a processor coupled to the multi-bit register to program the multi-bit register with the multi-bit value.

12. A method, comprising:
sequentially connecting each one of a plurality of variable capacitance switches of a capacitance sense user interface to a signal source via an input/output ("I/O") multiplexer bus;
reciprocally charging and discharging each of the variable capacitance switches through the I/O multiplexer bus;
sequentially connecting each one of the plurality of variable capacitance switches to capacitance measurement circuitry via the I/O multiplexer bus to monitor a capacitance of each of the variable capacitance switches; and
time sharing the capacitance measurement circuitry across a plurality of I/O ports each coupled to one of the variable capacitance switches to monitor the capacitance of each of the variable capacitance switches by iteratively reprogramming the I/O multiplexer bus under control of a processor.

13. The method of claim 12, wherein iteratively reprogramming the I/O multiplexer bus comprises programming a multi-bit register to open and close switches within the I/O multiplexer bus coupled to each of the I/O ports according to a sequence.

14. The method of claim 12, wherein:
the I/O multiplexer bus comprises a bus line coupled to the capacitance measurement circuitry and a plurality of bus line switches each coupled between one of the I/O ports and the bus line,
the signal source comprises a current source, and
reciprocally charging and discharging each of the variable capacitance switches through the I/O multiplexer bus comprises programming a multi-bit register to close each of the bus line switches in turn while the other bus lines switches are open.

15. The method of claim 14, wherein the measurement circuitry comprises:

a comparator having a first input coupled to the bus line and a second input coupled to receive a reference voltage;

measurement logic coupled to receive an output from the comparator, the measurement logic to measure at least one of a duty cycle, a frequency, or a period of the output from the comparator;

a discharge switch coupled to selectively discharge the bus line; and discharge logic coupled to receive the output from the comparator and to control the discharge switch in response to the output from the comparator.

16. The method of claim 12, wherein:

the I/O multiplexer bus comprises a bus line coupled to the capacitance measurement circuitry, a plurality of bus line switches each coupled between one of the I/O ports and the bus line, a voltage line coupled to the signal source, and a plurality of voltage line switches each coupled between the voltage line and one of the I/O ports;

the signal source comprises a voltage source, and reciprocally charging and discharging each of the variable capacitance switches through the I/O multiplexer bus comprises charging each of the variable capacitance switches with the voltage source and discharging each of the variable capacitance switches into a summing capacitor coupled to another one of the I/O ports.

* * * * *

UNITED STATES PATENT AND TRADEMARK OFFICE
CERTIFICATE OF CORRECTION

PATENT NO.        : 8,067,948 B2                                  Page 1 of 1
APPLICATION NO.   : 11/709866
DATED             : November 29, 2011
INVENTOR(S)       : Dennis R. Seguine It is certified that error appears in the above-identified patent and that said Letters Patent is hereby corrected as shown below:

In the Title page, Item (75) "Inventor" section, please replace the last name "Sequine" with --Seguine--.

Signed and Sealed this
Eighteenth Day of February, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,067,948 B2 | Page 1 of 1 |
| APPLICATION NO. | : 11/709866 | |
| DATED | : November 29, 2011 | |
| INVENTOR(S) | : Dennis R. Seguine | |

It is certified that error appears in the above-identified patent and that said Letters Patent is hereby corrected as shown below:

In the Title page, Item (12), delete "Sequine" and insert --Seguine--.

In the Title page, Item (75) "Inventor" section, please replace the last name "Sequine" with --Seguine--.

This certificate supersedes the Certificate of Correction issued February 18, 2014.

Signed and Sealed this
Twenty-fifth Day of March, 2014

Michelle K. Lee
*Deputy Director of the United States Patent and Trademark Office*